US010636208B2

(12) United States Patent
Eikhoff

(10) Patent No.: US 10,636,208 B2
(45) Date of Patent: Apr. 28, 2020

(54) SYSTEMS AND METHODS FOR GENERATING AN INTERACTIVE FLOOR PLAN

(71) Applicant: TRICK 3D, Atlanta, GA (US)

(72) Inventor: Chad E. Eikhoff, Atlanta, GA (US)

(73) Assignee: TRICK 3D, Atlanta, GA (US)

( * ) Notice: Subject to any disclaimer, the term of this patent is extended or adjusted under 35 U.S.C. 154(b) by 0 days.

(21) Appl. No.: 16/113,558

(22) Filed: Aug. 27, 2018

(65) Prior Publication Data

US 2018/0365892 A1  Dec. 20, 2018

Related U.S. Application Data

(63) Continuation of application No. 14/697,431, filed on Apr. 27, 2015, now Pat. No. 10,062,205.

(60) Provisional application No. 62/064,898, filed on Oct. 16, 2014.

(51) Int. Cl.
*G06T 17/00* (2006.01)
*G06T 17/20* (2006.01)
*G06F 16/583* (2019.01)
*G06T 15/60* (2006.01)

(52) U.S. Cl.
CPC .......... *G06T 17/20* (2013.01); *G06F 16/5854* (2019.01); *G06T 15/60* (2013.01)

(58) Field of Classification Search
CPC ... G06T 19/003; G06T 2210/04; G06F 17/50; G06F 17/5004
See application file for complete search history.

(56) References Cited

U.S. PATENT DOCUMENTS

| 5,572,635 | A | 11/1996 | Takizawa et al. |
| 6,563,529 | B1 | 5/2003 | Jongerius |
| 7,277,572 | B2 | 10/2007 | MacInnes et al. |
| 7,616,201 | B2 | 11/2009 | Foster |
| 8,768,655 | B2 | 7/2014 | Krebs et al. |
| 9,355,470 | B2 | 5/2016 | Merrell et al. |
| 9,525,862 | B2 | 12/2016 | Benhimane et al. |
| 9,953,112 | B2 | 4/2018 | Schultz |

(Continued)

OTHER PUBLICATIONS

Chief Architect X9 Reference Manual, www.chiefarchitect.com, pp. 950-959, 1990-2017.
SketchUp User's Guide, www.sketchup.com, pp. 197, 225, 2006.

*Primary Examiner* — Martin Mushambo
(74) *Attorney, Agent, or Firm* — Brient IP Law, LLC

(57) ABSTRACT

A computer-readable medium storing computer-executable instructions for generating a three-dimensional floor plan of a structure (e.g., a building, vehicle, or other structure) that includes a plurality of walls and at least one window. The three-dimensional floor plan includes internal building data such as height and orientation information for one or more rooms of the structure. The internal building data may include lighting elements and a view from the at least one window. The floor plan also includes external building data such as size, shape, location, and orientation of a second structure adjacent the first structure. The external building data may include points of interest and heavenly bodies. The system may allow a user to view the interior of a particular room and the exterior view from the particular room while manipulating the lighting conditions inside and/or outside of the particular room.

19 Claims, 21 Drawing Sheets

(56) References Cited

U.S. PATENT DOCUMENTS

| | | |
|---|---|---|
| 2008/0120069 A1 | 5/2008 | Martin et al. |
| 2008/0126022 A1* | 5/2008 | Hoguet ............... G06F 17/5081 703/1 |
| 2008/0180439 A1* | 7/2008 | Adabala ............... G06T 11/206 345/421 |
| 2008/0252640 A1 | 10/2008 | Williams |
| 2011/0001751 A1* | 1/2011 | Carlsson ............ G01C 21/3638 345/419 |
| 2011/0069158 A1 | 3/2011 | Shiloh et al. |
| 2011/0140928 A1* | 6/2011 | Ren ................... G01C 21/3638 340/995.14 |
| 2012/0095730 A1* | 4/2012 | Krebs ................. G06F 17/5004 703/1 |
| 2012/0173209 A1* | 7/2012 | Krebs ................. G06F 17/5004 703/1 |
| 2012/0249539 A1 | 10/2012 | Bhattacharya et al. |
| 2012/0259594 A1* | 10/2012 | Khan ..................... G06T 13/60 703/1 |
| 2012/0296610 A1* | 11/2012 | Hailemariam .......... G06T 19/00 703/1 |
| 2013/0222373 A1* | 8/2013 | Weinstein .............. G06Q 50/16 345/419 |
| 2014/0013263 A1* | 1/2014 | Bailiang .............. G09B 29/106 715/771 |
| 2014/0095122 A1* | 4/2014 | Appleman ............ G06T 19/003 703/1 |
| 2014/0227025 A1 | 8/2014 | Giveans |
| 2015/0131871 A1* | 5/2015 | Chen .................. G06K 9/00476 382/113 |
| 2015/0227644 A1* | 8/2015 | Schultz ............... G06F 17/5004 703/1 |
| 2015/0302637 A1 | 10/2015 | Glaser |
| 2015/0324940 A1* | 11/2015 | Samson ........... G06Q 10/06313 705/7.23 |
| 2016/0110916 A1* | 4/2016 | Eikhoff ............... G06F 16/5854 345/420 |
| 2016/0212406 A1 | 7/2016 | Hayasaka et al. |

* cited by examiner

SYSTEMS AND METHODS FOR GENERATING AN INTERACTIVE FLOOR PLAN

CROSS-REFERENCE TO RELATED APPLICATIONS

This application is a continuation of U.S. patent application Ser. No. 14/697,431, filed Apr. 27, 2015, which claims the benefit of U.S. Provisional Patent Application Ser. No. 62/064,898, filed Oct. 16, 2014, entitled Systems and Methods for Generating an Interactive Floor Plan, the entire disclosures of which are hereby incorporated by reference in their entirety.

COPYRIGHT

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

When buying and selling real estate that has not yet been constructed, including residential and commercial properties, computer graphics and blueprints are used to represent the proposed design. Such computer graphics and blueprints contain representations of square footage and layout, for instance, but do not contain depictions of what the actual interior and exterior lighting and views will be for the unbuilt property. While computer graphics can demonstrate furniture layouts and designs for kitchens and bathrooms, the current systems do not offer a realistic view of the world outside of the property or the lighting conditions caused by the rotation of the world for the interior of the building. Thus, it is difficult to determine what the interior of a building will look like and what the views will be before the building is built. This problem is compounded for high-rise buildings where a particular elevated view may not yet exist. This issue is especially problematic for those in urban areas or recreational areas where views may be the centerpiece or selling point for the property.

Various embodiments of the present systems and methods recognize and address the foregoing considerations, and others, of prior art systems and methods.

SUMMARY OF THE VARIOUS EMBODIMENTS

According to various embodiments, a computer-readable medium storing computer-executable instructions for: (1) receiving a floor plan comprising at least one room within a floor of a first building, the room comprising a plurality of walls and at least one window; (2) receiving a set of building location data that includes the height and orientation of the at least one room; (3) receiving a set of external building data representing the size, shape, location and orientation of a second building that is disposed adjacent the first building; and (4) using the floor plan, the set of building location data, and the set of external building data to create a three-dimensional version of the floor plan, the three-dimensional version of the floor plan comprising a view out of the window that comprises a view of the second building.

BRIEF DESCRIPTION OF THE DRAWINGS

Various embodiments of the systems and methods for generating an interactive floor plan are described below. In the course of this description, reference will be made to the accompanying drawings, which are not necessarily drawn to scale and wherein.

DETAILED DESCRIPTION OF SOME EMBODIMENTS

Figure 1:
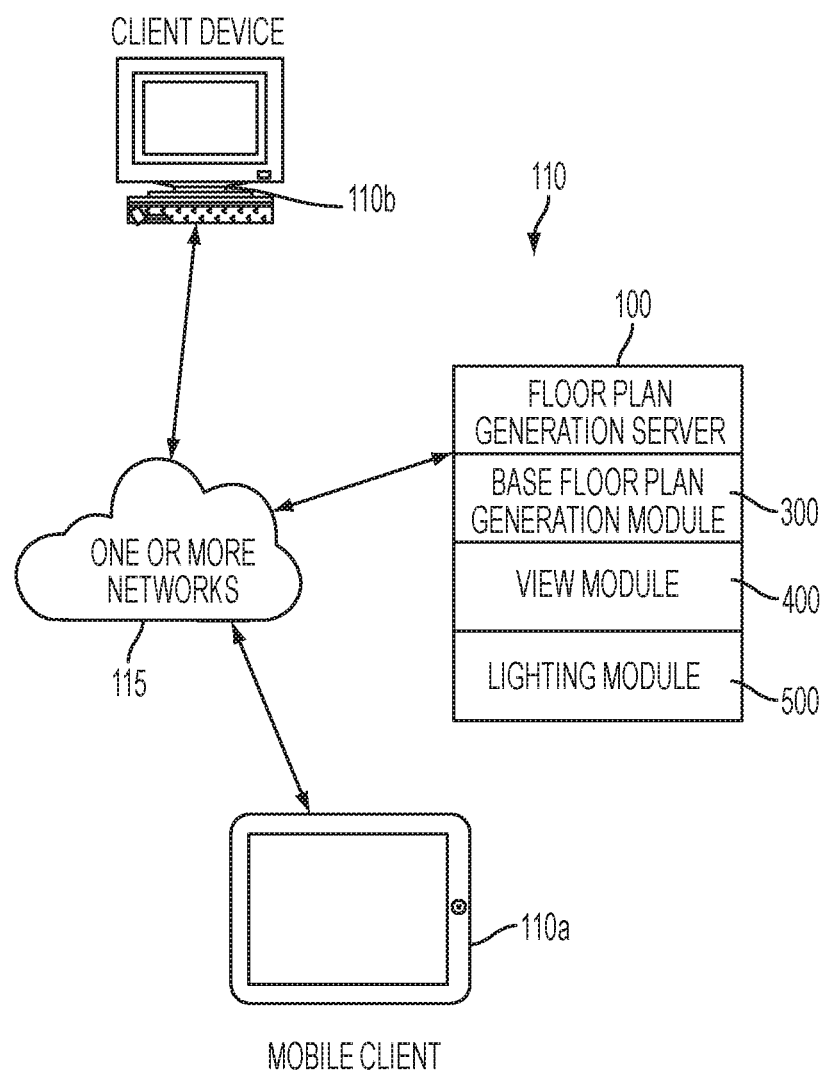
FIG. 1 is a block diagram of a floor plan generation server in accordance with an embodiment of the present system.

Various embodiments will now be described more fully hereinafter with reference to the accompanying drawings. It should be understood that the invention may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Overview

A system, according to various embodiments, is adapted to generate a three-dimensional floor plan of an architectural structure (e.g., a condominium, a house, an apartment, or an office building). The floor plan may be useful in allowing a user (e.g., a potential buyer) to simulate what it would be like to be inside one or more rooms of the building. This may be especially useful, for example, in the context of selling real estate to a potential buyer before the structure being sold is built. It may also be helpful in allowing a remote user to experience the interior of an already-built structure and/or in the context of decorating the interior of an already built or to-be-built home or building.

In particular embodiments, the floor plan is interactive (e.g., it may allow a user to virtually walk through one or more rooms within the building) and may include one or more window views that at least substantially accurately depict the view out of at least one (e.g., all of) of the room's windows. Such window views may include, for example, one or more three-dimensional representations of: (1) one or more architectural structures that are adjacent the building; (2) one or more roads that are adjacent the building; (3) one or more trees or bushes that are adjacent the building; and/or (4) any other items of interest that an inhabitant of the building would see through the window. In various embodiments, the views may include one or more architectural structures that are being developed but have not yet been built. For example, a second building that will be part of the same development as the building the user is viewing.

In particular embodiments, the window views may also at least substantially accurately depict the position of one or more heavenly bodies (e.g., the sun, moon, constellations and/or individual stars other than the sun), e.g., relative to a particular reference point. In various embodiments, the system may be adapted to allow a user to selectively view the position of the heavenly bodies at different times of the day and/or at different times of the year. In various embodiments, the system may be adapted to approximate the position of the heavenly bodies based on a particular season (e.g., summer, fall, winter, spring). In particular embodiments, the system may be adapted to display a graphical representation of the sun as it travels along its projected path over a particular period of time (e.g., from sunrise to sunset) on a particular day or at a particular time of year. In other embodiments, the system may be adapted to allow a user to view particular types of weather from the room's windows (e.g., sunny, partly cloudy, cloudy, fog, rain, drizzle, snow, dust, haboob, etc.).

In particular embodiments, the system is adapted to create a visual representation of the lighting within the interior of a virtual depiction of a room within the floor plan. This virtual representation may comprise, for example, a simulation of both man-made light from any man-made lighting within the room and/or any natural (or other external) light that is expected to come through the room's windows or other exterior openings. In particular embodiments, the system is adapted to determine the natural light based on the approximate position of one or more heavenly bodies (e.g., the sun or moon). Accordingly, the system may be adapted to change the lighting within the room as the system repositions the heavenly bodies as discussed above. This may, for example, help the user to understand how the natural lighting within the room will change over the course of the day at different times of the year. In various embodiments, the system may be adapted to allow a user to change the location of the man-made lighting within the room and add different light sources and types of lighting (e.g., overhead lights, lamps, incandescent lights, fluorescent lights, LED lights, high-intensity discharge lights, etc.).

In further embodiments, the system may be configured to selectively display one or more two or three-dimensional representations of art and/or furniture within the virtual depiction of one or more rooms within the floor plan. This may, for example, allow a user to understand how the room will look when decorated in a particular way. In various embodiments, the system may be configured to allow a user to interactively move the art and/or furniture around the virtual room. In particular embodiments, the user may provide (e.g., upload or download), and/or select, one or more data files (e.g., one or more CAD files) that include data regarding the two-dimensional or three-dimensional appearance of a particular piece of furniture, piece of artwork, or other item, and the system may then use this data to recreate a two or three dimensional representation of the item within the context of the virtual room. In various embodiments, the system may allow a user to change the color of the walls, floors, and ceiling. This may allow a user to visualize how the paint and other materials will interact with the lighting from inside and outside of the building.

Exemplary Technical Platforms

As will be appreciated by one skilled in the relevant field, the present systems and methods may be, for example, embodied as a computer system, a method, or a computer program product. Accordingly, various embodiments may be entirely hardware or a combination of hardware and software. Furthermore, particular embodiments may take the form of a computer program product stored on a computer-readable storage medium having computer-readable instructions (e.g., software) embodied in the storage medium. Various embodiments may also take the form of web-implemented computer software. Any suitable computer-readable storage medium may be utilized including, for example, hard disks, compact disks, DVDs, optical storage devices, and/or magnetic storage devices.

Various embodiments are described below with reference to block diagram and flowchart illustrations of methods, apparatuses, (e.g., systems), and computer program products. It should be understood that each block of the block diagrams and flowchart illustrations, and combinations of blocks in the block diagrams and flowchart illustrations, respectively, can be implemented by a computer executing computer program instructions. These computer program instructions may be loaded onto a general purpose computer, a special purpose computer, or other programmable data processing apparatus that can direct a computer or other programmable data processing apparatus to function in a particular manner such that the instructions stored in the computer-readable memory produce an article of manufacture that is configured for implementing the functions specified in the flowchart block or blocks.

The computer instructions may execute entirely on the user's computer, partly on the user's computer, as a stand-alone software package, partly on a user's computer and partly on a remote computer, or entirely on the remote computer or server. In the latter scenario, the remote computer may be connected to the user's computer through any type of network, including but not limited to: a local area network (LAN); a wide area network (WAN); a cellular network; or the connection may be made to an external computer (for example, through the Internet using an Internet Service Provider).

These computer program instructions may also be stored in a computer-readable memory that can direct a computer or other programmable data processing apparatus to function in a particular manner such that the instructions stored in the computer-readable memory produce an article of manufacture that is configured for implementing the function specified in the flowchart block or blocks. The computer program instructions may also be loaded onto a computer or other programmable data processing apparatus to cause a series of operational steps to be performed on the computer or other programmable apparatus to produce a computer-implemented process (e.g., method) such that the instructions that execute on the computer or other programmable apparatus provide steps for implementing the functions specified in the flowchart block or blocks.

Example System Architecture

FIG. 1 is a block diagram of a System 110 according to a particular embodiment. As may be understood from this figure, the System 110 includes a Floor Plan Generation Server 100, One or More Networks 115, One or More Computing Devices 110a, 110b (e.g., such as a smart phone, a tablet computer, a wearable computing device, a laptop computer, a desktop computer, etc.), a Base Floor Plan Generation Module 300, a View Module 400, and a Lighting Module 500.

The One or More Networks 115 may include any of a variety of types of wired or wireless computer networks such as the Internet, a private intranet, a mesh network, a public switch telephone network (PSTN), or any other type of network (e.g., a network that uses Bluetooth or near field communications to facilitate communication between computing devices). The communication link between the One or More Computing Devices 110a, 110b and the Floor Plan Generation Server 100 may be, for example, implemented via a Local Area Network (LAN) or via the Internet.

Figure 2:
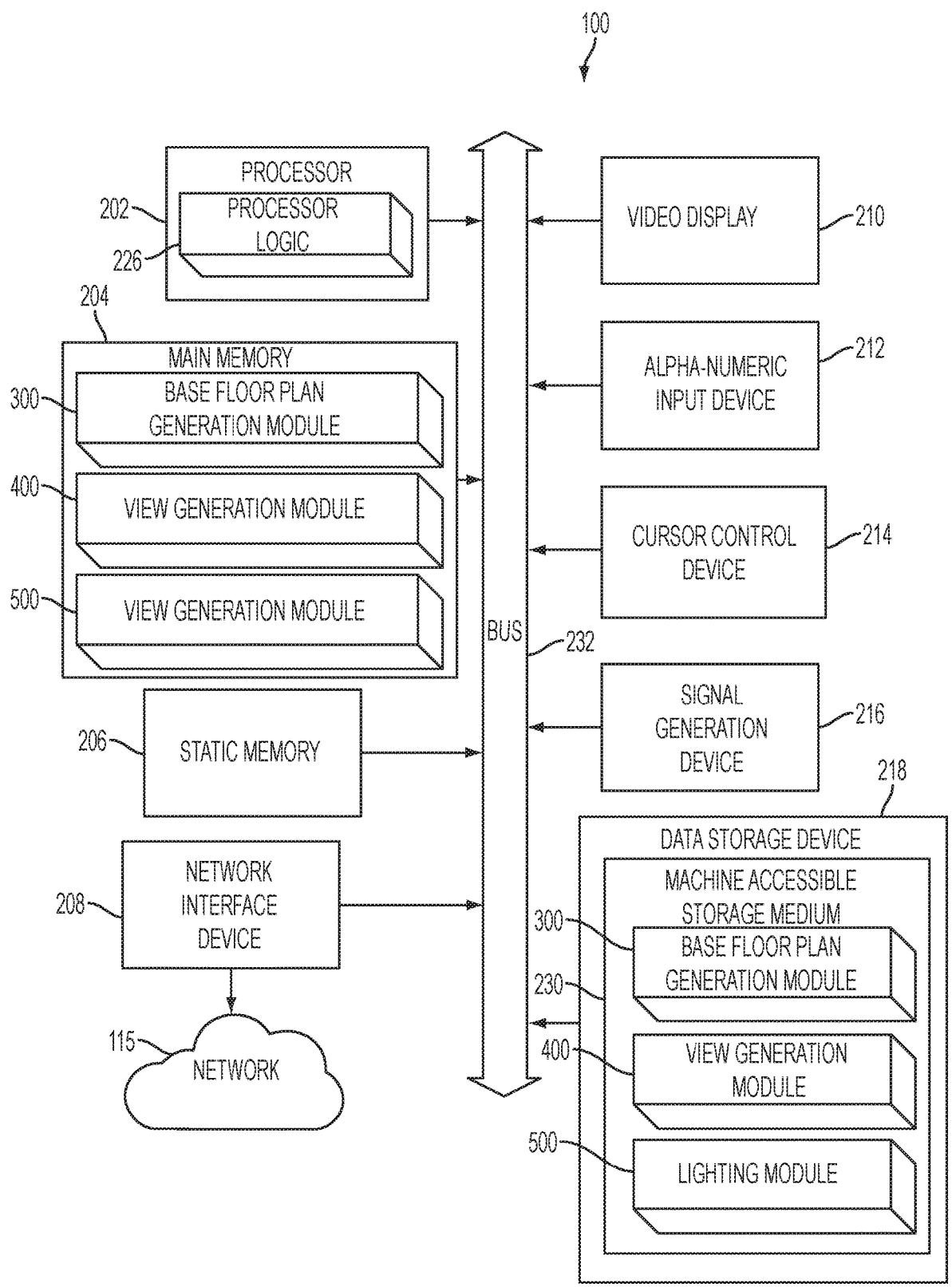
FIG. 2 is a schematic diagram of a computer, such as the floor plan generation server of FIG. 1, that is suitable for use in various embodiments.

FIG. 2 illustrates a diagrammatic representation of the architecture for the Floor Plan Generation Server 100 that may be used within the System 110. It should be understood that the computer architecture shown in FIG. 2 may also represent the computer architecture for any one of the One or More Computing Devices 110a, 110b, shown in FIG. 1. In particular embodiments, the Floor Plan Generation Server 100 may be suitable for use as a computer within the context of the System 100 that is configured for receiving one or more floor plans, receiving building location data for a first building, receiving external building data for a second building, and using the one or more floor plans and building data to create three-dimensional versions of the floor plans.

In particular embodiments, the Floor Plan Generation Server 100 may be connected (e.g., networked) to other computing devices via a LAN, an intranet, an extranet, and/or the Internet as shown in FIG. 1. As noted above, the Floor Plan Generation Server 100 may operate in the capacity of a server or a client computing device in a client-server network environment, or as a peer computing device in a peer-to-peer (or distributed) network environment. The Floor Plan Generation Server 100 may be a desktop personal computing device (PC), a tablet PC, a set-top box (STB), a Personal Digital Assistant (PDA), a cellular telephone, a web appliance, a network router, a switch or bridge, or any other computing device capable of executing a set of instructions (sequential or otherwise) that specify actions to be taken by that computing device. Further, while only a single computing device is illustrated, the term "computing device" should also be interpreted to include any collection of computing devices that individually or jointly execute a set (or multiple sets) of instructions to perform any one or more of the methodologies discussed herein.

An exemplary Floor Plan Generation Server 100 includes a processing device 202, a main memory 204 (e.g., read-only memory (ROM), flash memory, dynamic random access memory (DRAM) such as synchronous DRAM (SDRAM) or Rambus DRAM (RDRAM), etc.), a static memory 206 (e.g., flash memory, static random access memory (SRAM), etc.), and a data storage device 218, which communicate with each other via a bus 232.

The processing device 202 represents one or more general-purpose or specific processing devices such as a microprocessor, a central processing unit (CPU), or the like. More particularly, the processing device 202, for example, may be a complex instruction set computing (CISC) microprocessor, reduced instruction set computing (RISC) microprocessor, very long instruction word (VLIW) microprocessor, or processor implementing other instruction sets, or processors implementing a combination of instruction sets. The processing device 202 may also be one or more special-purpose processing devices such as an application specific integrated circuit (ASIC), a field programmable gate array (FPGA), a digital signal processor (DSP), network processor, or the like. The processing device 202 may be configured to execute processing logic 226 for performing various operations and steps discussed herein.

The Floor Plan Generation Server 100 may further include a network interface device 208. The Floor Plan Generation Server 100 may also include a video display unit 210 (e.g., a liquid crystal display (LCD) or a cathode ray tube (CRT)), an alpha-numeric input device 212 (e.g., a keyboard), a cursor control device 214 (e.g., a mouse), and a signal generation device 216 (e.g., a speaker).

The data storage device 218 may include a computer-readable medium 230 (also known as a non-transitory computing device-readable storage medium or a non-transitory computing device-readable medium or a machine accessible storage medium) on which is stored one or more sets of instructions (e.g., the Base Floor Plan Generation Module 300, the View Module 400, and the Lighting Module 500) embodying any one or more of the methodologies or functions described herein. The Base Floor Plan Generation Module 300, the View Module 400, and the Lighting Module 500 may also reside, completely or at least partially, within the main memory 204 and/or within the processing device 202 during execution thereof by the Floor Plan Generation Server 100—the main memory 204 and the processing device 202 also constituting computer-readable medium. The Base Floor Plan Generation Module 300, the View Module 400, and the Lighting Module 500 may further be transmitted or received over a network 115 via a network interface device 208.

While the computer-readable medium 230 is shown in an exemplary embodiment to be a single medium, the term "computing device-accessible storage medium" should be understood to include a single medium or multiple media (e.g., a centralized or distributed database, and/or associated caches and servers) that store the one or more sets of instructions. The term "computer-readable medium" should also be understood to include any medium that is capable of storing, encoding, or carrying a set of instructions for execution by the computing device and that causes the computing device to include any one or more of the methodologies of the present invention. The term "computing device-accessible storage medium" should accordingly be understood to include, but not be limited to, solid-state memories, optical and magnetic media, etc.

Exemplary System Platform

As noted above, a system, according to various embodiments, is adapted to perform a variety of different functions relating to interactive floor plans. The system may generate, for example, an interactive, three-dimensional floor plan that includes views and lighting.

Various aspects of the system's functionality may be executed by certain system modules, including the Base Floor Plan Generation Module 300, the View Module 400, and the Lighting Module 500. The Base Floor Plan Generation Module 300, the View Module 400, and the Lighting Module 500 are discussed in greater detail below.

Base Floor Plan Generation Module

Figure 3:
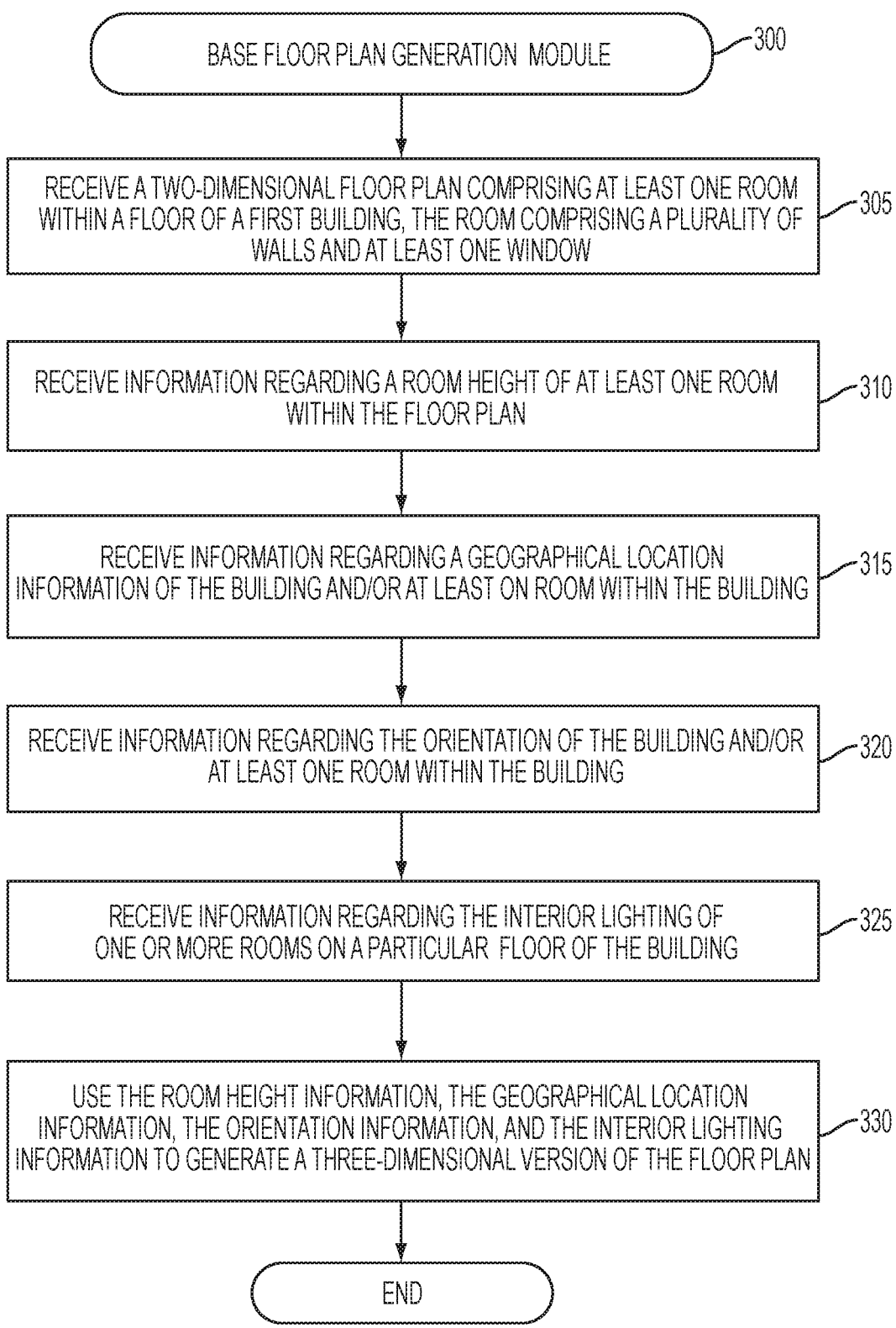
FIG. 3 depicts a flowchart that generally illustrates various steps executed by a base floor plan generation module that, for example, may be executed by the floor plan generation server of FIG. 1.

FIG. 3 is a flow chart of operations performed by an exemplary Base Floor Plan Generation Module 300, which may, for example, run on the Floor Plan Generation Server 100, or any suitable computing device (such as a suitable mobile computing device). In particular embodiments, the Base Floor Plan Generation Module 300 may facilitate generating a three-dimensional version of a floor plan.

In various embodiments, the system begins at Step 305 by receiving a two-dimensional floor plan. In various embodiments, the floor plan may include at least one room within a floor of a first building. The room of the first building may include a plurality of walls, one or more doors, and at least one window. In various embodiments, the room may be any suitable room. For instance, in some embodiments, the room may be a kitchen, living room, bedroom, bathroom, office, multi-purpose room, etc.

In particular embodiments, the system may receive the two-dimensional floor plan from a floor plan database. The two-dimensional floor plan may include details such as room sizes, wall lengths, fixtures, notes for construction finishes, and electrical items. In various embodiments, the system may allow a user to manually enter a two-dimensional floor plan. For example, the system may allow a user to enter the dimensions of a proposed two-bedroom, two-bathroom condominium in a building.

In various embodiments, the two-dimensional floor plan may include information regarding a location, size, height, and shape of the one or more doors and the at least one window within the floor plan. In particular embodiments, the information regarding the location, size, and shape of the one or more windows and the one or more doors may include measurements in any suitable unit of length (e.g., feet, inches, meters, yards, etc.). For example, the information regarding a particular window may include that the window is ten feet high by ten feet wide. In some embodiments, the system may be configured to allow a user to manually enter the location, size, and shape information. In some embodiments, the system may receive the location, size, and shape information from an architect, a builder, or any other suitable source.

Continuing to Step 310, the system receives information regarding a room height of the at least one room within the floor plan. In various embodiments, the height information may be manually entered by a user. In particular embodiments, the system may receive the room height information from a floor plan database. In other embodiments, the system may be configured to receive the room height information from a scanning device connected to a computing device.

In various embodiments, the room height information may consist of a measurement in any suitable unit of length. In particular embodiments, the room height information may also include varying heights for the room if the ceiling of the room is not flat and horizontal. For instance, where the ceiling is slanted, the room height information may contain the measurements for the slope of the ceiling and for other variations in height.

Next, at Step 315, the system receives information regarding the geographical location information of the first building (e.g. the first building's geolocation) and/or at least one room within the first building. In various embodiments, the system may receive the geographical location information from any suitable source. In various embodiments, the system may receive the geographical location information from an interactive map. For example, the system may receive the geographical location information from a GPS device, Google Maps, or a similar locating service or device.

In particular embodiments, in addition to receiving the geographical location information of the first building, the system may also receive a second geographical location information of a second building located adjacent to the first building. The second geographical location information may include external building data for the second building such as size, shape, location, and orientation of the second building. In various embodiments, the geographical location information and the second geographical location information may include an address of the first building and the second building, respectively. In particular embodiments, the geographical location information of the first building and the geographical location information of the second building may include a scale view of the first building that shows substantially to scale a distance between the first building and the second building.

In some embodiments, the geographical location information may include external building data for a third building that is adjacent the first building. The external building data for the third building may include the size, shape, location, and orientation of the third building. In particular embodiments, the geographical location information of the first building and the third building may include a scale view of the first building that shows substantially to scale a distance between the first building and the third building. The external data may also include the size, shape, and location of one or more roadways that are adjacent the first building.

At Step 320, the system continues by receiving information regarding the orientation of the building and/or at least one room within the building. In various embodiments, the system may receive the orientation information from manual input by the user. In particular embodiments, the system may receive the orientation information from a floor plan database. In various embodiments, the orientation information may include a cardinal direction, an intercardinal direction, and/or secondary-intercardinal direction (e.g., north, south, east, west, northeast, southeast, southwest, northwest, north-northeast, east-northeast, east-southeast, south-southeast, south-southwest, west-southwest, west-northwest, north-northwest, etc.). For example, the orientation information of at least one room within the building such as a living room may be that the window faces south.

In other embodiments, the orientation information may include directional information (e.g., up, down, top, bottom, left, right, etc.). For example, the orientation information may include that a living room of a particular unit is located at a particular height above the ground or sea level, and/or that the living room is located above a living room of a second particular unit. In various embodiments, the system may store the orientation information in system memory. In particular embodiments, the orientation information may be auto-generated by the system. In some embodiments, the system may receive orientation information from a GPS-enabled device, Google Maps, or any other suitable source.

Continuing to Step 325, the system receives information regarding the interior lighting of one or more rooms (e.g., each room) on a particular floor of the building. In various embodiments, the interior lighting information may be auto-generated by the system using any suitable lighting algorithm. In some embodiments, the interior lighting information may be manually entered by the user.

In various embodiments, the interior lighting information may include interior man-made lighting information that may include information regarding interior man-made lighting installed into the building. For example, the interior man-made lighting information may include one or more lamps and one or more wall and overhead lighting systems for a particular floor. In some embodiments, the interior man-made lighting information may also include man-made lighting emanating from behind wall panels and/or one or more doors. In particular embodiments, the system may store the interior man-made lighting information in memory.

Next, at Step 330, the system uses the location, size, and shape information, the room height information, the geographical location information, the orientation information, and the interior lighting information to generate a three-dimensional version of the floor plan. In various embodiments, the three-dimensional version of the floor plan may include at least one view from the at least one window. In some embodiments, the second building may be seen in the view from the at least one window. In particular embodiments, the internal lighting may vary depending upon the time of day and/or season of the year.

In various embodiments, the system is configured to calculate the area of a particular room and a particular building to generate the three-dimensional version of the floor plan. In particular embodiments, the system may combine the window and door location and size information, the room height information, the geographical location information, the orientation information, and the interior lighting information to generate the three-dimensional version of the floor plan. In some embodiments, the system may combine the window and door location and size information, the room height information, the geographical location information, the orientation information, and the interior lighting information using a scanning device connecting to a computing device to generate the three-dimensional version of the floor plan. For example, where the architect or builder has created an accurate model of the building, the system may scan the model to generate the three-dimensional version of the floor plan.

In various embodiments, the system will display the three-dimensional version of the floor plan on a user interface of a computing device. In some embodiments, the user may view the virtual reality building using virtual reality goggles. In particular embodiments, the system may display the three-dimensional version of the floor plan through a life-size projection into a space around the user. For example, the system may display the three-dimensional version of a two-bedroom, two-bathroom condominium in virtual reality, allowing the user to walk through the various rooms of the condominium. In alternative embodiments, the system may allow the user to virtually interact with the environment. For instance, the system may allow the user to play a virtual game in the space surrounding the user.

View Generation Module

Figure 4:
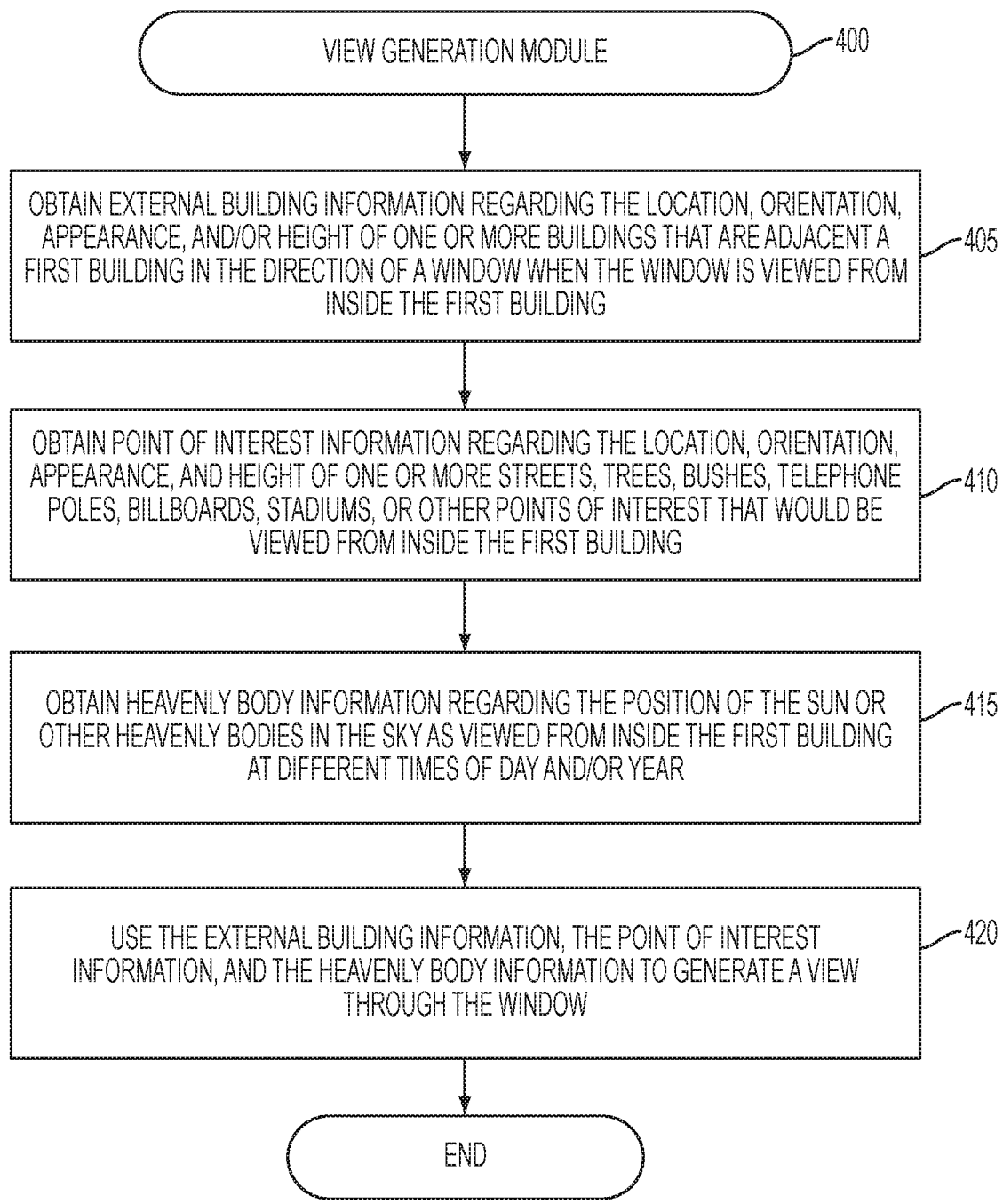
FIG. 4 depicts a flowchart that generally illustrates various steps executed by a view generation module that, for example, may be executed by the floor plan generation server of FIG. 1.

FIG. 4 is a flow chart of operations performed by an exemplary View Generation Module 400, which may, for example, run on the Floor Plan Generation Server 100, or any other suitable computing device (such as a suitable mobile computing device). In particular embodiments, the View Generation Module 400 obtains building information for a building, external building information, and sun information to generate a view through a window of the building. In various embodiments, the sun information may include information on the intensity of the rays of the sun and the distance of the sun to the earth for the location of the particular building.

Beginning at Step 405, the system obtains external building information regarding the location, orientation, appearance, and/or height of one or more buildings that are adjacent a first building in the direction of a window when the window is viewed from inside the first building. In particular embodiments, the system obtains external building information from a map such as Google Maps. In other embodiments, the system allows a user to manually enter the external building information. In various embodiments, the system obtains external building information from one or more photographs taken of an area surrounding the first building.

In some embodiments, the view from the window when viewed from inside the first building (e.g. including the location of one or more heavenly bodies as viewed through the window) is determined by one or more photographs taken at a single height and/or varying heights using cranes or other elevation devices to mimic the height of different floors of the first building once it is built. In particular embodiments, the one or more photographs may be taken by a professional photographer. In other embodiments, the system obtains the external building information from a drone with a camera. In various embodiments, the one or more buildings adjacent the first building may include one or more structures that are being developed but have not yet been built.

In some embodiments, the one or more buildings adjacent the first building may have one or more external lights that may be viewed from inside the first building at different times of the day. In other embodiments, the one or more buildings adjacent the first building may be varying distances away from the first building. For example, the first building and the second building may be one mile apart, but due to each of their heights or the heights of the buildings or other structures between them, a user would be able to see the second building from the first building once the first building is built.

Next, at Step 410, the system obtains "point of interest" information regarding the location, orientation, appearance, and height of one or more points of interest. In various embodiments, the one or more points of interest may include one or more roadways, streets, sidewalks, trees, bushes, businesses, residences, telephone poles, billboards, stadiums, and any other point of interest information that would be viewed from inside the first building. In particular embodiments, the system obtains point of interest information from a map such as Google Maps. In other embodiments, the system allows a user to manually enter the point of interest information.

In various embodiments, the system obtains point of interest information from one or more photographs taken of an area surrounding the first building. In some embodiments, the one or more points of interest are determined by one or more photographs taken at varying heights using cranes or other elevation devices to mimic the height of different floors of the first building. In particular embodiments, the one or more photographs may be taken by a professional photographer.

In other embodiments, the system obtains the point of interest information from a drone. In various embodiments, the one or more points of interest may be structures that are being developed but that have not yet been built. In some embodiments, the point of interest information may include lights that may be viewed from inside the first building at different times of the day.

Continuing to Step 415, the system obtains heavenly body information regarding the position of the sun or other heavenly bodies in the sky (e.g., as viewed from inside the first building) at different times of day and/or year. In various embodiments, the heavenly body information includes the position of stars, planets, the moon, and/or the sun (e.g., relative to the Earth's surface or other suitable reference point). In particular embodiments, the system obtains the heavenly body information from a sky map such as Google Sky. For example, the heavenly body information obtained from Google Sky may include constellations that may be seen from the building once it is built at particular times of the day.

In various embodiments, the system may allow the user to manually enter the heavenly body information. In other embodiments, the system obtains the heavenly body information from a weather service. In particular embodiments, the system obtains the heavenly body information from an astronomical almanac. In various embodiments, the system may obtain the heavenly body information from one or more photographs taken at different times during the day and year.

In various embodiments, the heavenly body information is estimated by determining the average position of the heavenly bodies during a particular season of the year. For example, the system may estimate the average position of the sun during the summer for the location of the first building. In various embodiments, the heavenly body information may include the sun's position for different parts of the day such as dawn, sunrise, morning, daylight, solar noon, evening, sunset, dusk, and night. In other embodiments, the sun's position may be computer generated. In various embodiments, the system will approximate the sun's position.

In particular embodiments, the heavenly body information includes a first set of sun positions regarding a first position of the sun in the sky when viewed from the first building at a first particular time of day. In some embodiments, the heavenly body information includes a second set of sun position data regarding a second position of the sun in the sky when viewed from the first building at a second particular time of day.

At Step 420, the system then uses the external building information, the point of interest information, and the heavenly body information to generate a view through the window. In various embodiments, the view through the window will include buildings, points of interest, and heavenly bodies. In particular embodiments, the view through the window may include substantially all of the external building information, the points of interest, and the heavenly bodies. In various embodiments, the view through the window may include only a portion of the external building information, the points of interest, and the heavenly bodies.

In particular embodiments, the view through the window may vary depending, at least in part, upon the time of day and/or season in the year. In particular embodiments, the view through the window may include one or more constellations moving in real time. In some embodiments, the view through the window may vary depending, at least in part, upon the angle that the user is viewing the one or more external buildings, the one or more points of interest, and the one or more heavenly bodies from inside the first building. For example, the angle that the user is viewing the one or more points of interest may depend upon the user's proximity to the window, such that a closer proximity to the window will result in a larger angle and a farther proximity to the window will result in a smaller angle. In particular embodiments, the system will generate the view through the window by lining up the pictures taken from a crane or other elevation device with the proposed size and shape of the window.

In various embodiments, the system will display the view through the window on a user interface of a computing device. In some embodiments, the system may display the view through the window using virtual reality goggles. In particular embodiments, the system may display the view through the window through a life-size projection into a space around the user. For example, the system may display the view through the window of a living room of a condominium in virtual reality, allowing the user to see the views from the window from different angles as the user virtually walks through the space (e.g., by moving a virtual camera through the space as is currently done in "first person shooter" games). In various embodiments, the system may combine the three-dimensional version of the floor plan and the views through the window to create a virtual reality room with a view for the user.

Lighting Module

Figure 5:
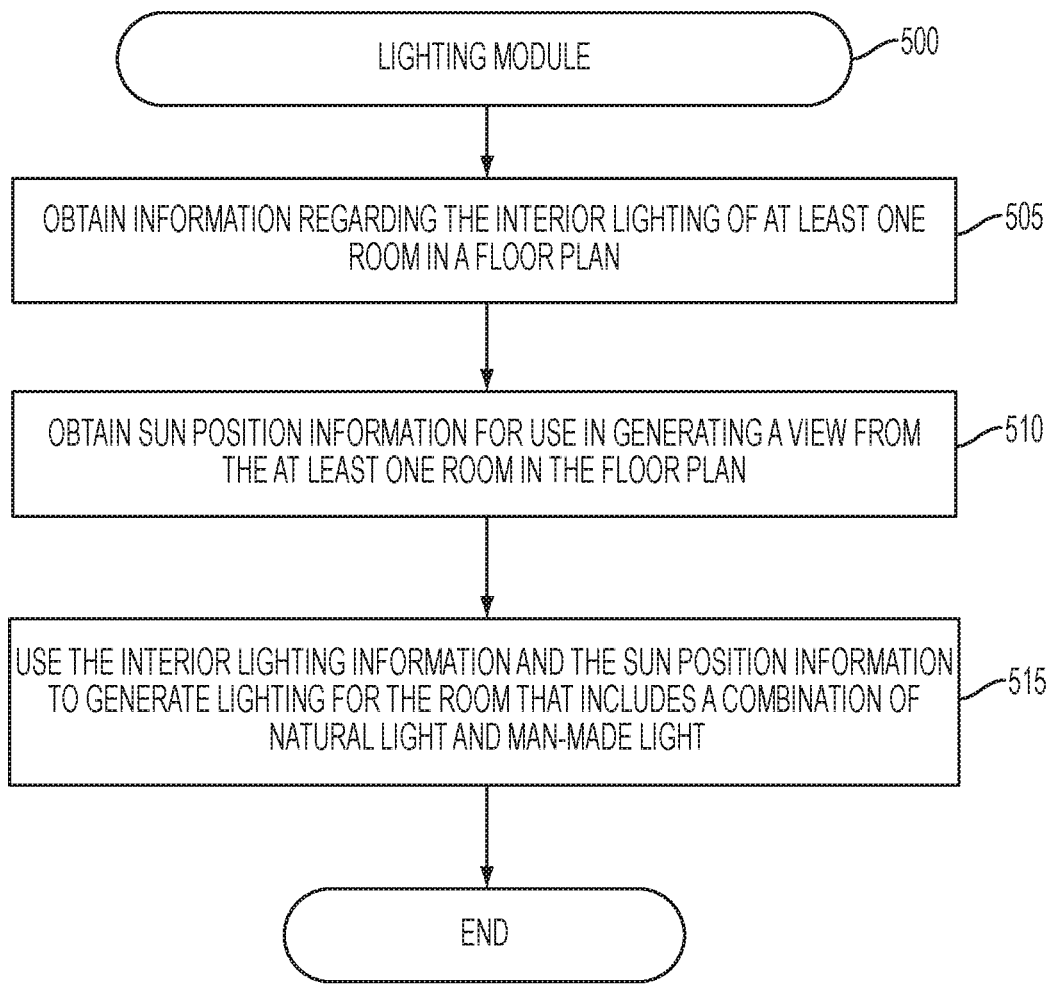
FIG. 5 depicts a flowchart that generally illustrates various steps executed by a lighting module that, for example, may be executed by the floor plan generation server of FIG. 1.

FIG. 5 is a flow chart of operations performed by an exemplary Lighting Module 500, which may, for example, run on the Floor Plan Generation Server 100, or any suitable computing device (such as a suitable mobile computing device). In particular embodiments, the Lighting Module 500 obtains interior lighting information and sun position information (e.g., obtaining the information from a floor plan database) to generate lighting for at least one room in a floor plan.

Beginning at Step 505, the system obtains information regarding the interior lighting of at least one room in a floor plan (e.g., from a floor plan database). In various embodiments, the system obtains the interior lighting information from manual input by a user. In particular embodiments, the system may obtain the interior lighting information from the three-dimensional floor plan. In other embodiments, the interior lighting includes wall, ceiling, and/or one or more freestanding light sources. In particular embodiments, the interior lighting is man-made lighting. In some embodiments, the interior lighting is natural lighting.

In particular embodiments, the interior lighting may include shadowing created by sunlight, moonlight, or man-made light. In some embodiments, the shadowing may vary depending upon the time of day and/or season of the year. In various embodiments, the system may allow the user to manually move the man-made lighting thereby changing the interior lighting information and the shadowing. In particular embodiments, the interior natural lighting information may include reflections created by light reflecting off of a smooth surface (e.g., glass, plastic, stone, etc.).

At Step 510, the system obtains sun position information for use in generating a view from the at least one room in the floor plan. In various embodiments, the sun position information is auto-generated from a sun position algorithm. In particular embodiments, the sun position information includes sun position data that relates to the approximate path that the sun travels in the sky as the earth rotates specific to the location of the building on Earth. In some embodiments, the sun position data is the approximate path that the sun travels in the sky as the earth rotates over the course of zero to four (0-4) daylight hours (or any other suitable, predetermined range of hours) on a particular day.

In various embodiments, the sun position information includes a first set of sun position data regarding a first position of the sun in the sky when viewed from the first building at a first particular time of day. In particular embodiments, the first position of the sun is the position of the sun during a particular time of day (e.g., in the morning, evening, day, night). In other embodiments, the first position of the sun is the position of the sun during a particular time of year (e.g., during the summer, winter, fall, spring).

In various embodiments, the sun position information includes a second set of sun position data regarding a second position of the sun in the sky when viewed from the first building at a second particular time of day. In particular embodiments, the second position of the sun is the position of the sun during a particular time of day (e.g., in the morning, evening, day, night). In other embodiments, the second position of the sun is the position of the sun during a particular time of year (e.g., during the summer, winter, fall, spring).

Continuing to Step 515, the system uses the interior lighting information and the sun position information to generate lighting for the room. In various embodiments, the lighting for the room may include a combination of natural light and man-made light. In various embodiments, the system may generate lighting for the room by superimposing the natural light over the man-made light to create an overall lighting effect in the room.

In particular embodiments, the system will generate the lighting for the room by adding the interior lighting information to the sun position information. In other embodiments, the system may allow the user to add or subtract additional interior lighting information to generate the lighting for the room. In still other embodiments, the system may allow the user to change the position of the sun to generate the lighting for the room.

In various embodiments, the system uses the first set of sun position data, the second set of sun position data, the floor plan, the set of building location data, and the set of external building data to create the three-dimensional version of the floor plan. In particular embodiments, the system stores instructions for receiving a request from a user to view a three-dimensional version of the floor plan that depicts the at least one room at the first particular time of day and in response to receiving the request, the system displays a particular three-dimensional version of the floor plan that includes a visual representation of the sun in a particular position that is determined, at least in part, based on the first sun position data.

In various embodiments, the system stores instructions for receiving a request from a user to view a second three-dimensional version of the floor plan that depicts the at least one room at a second particular time of day and in response to receiving the request, the system displays a particular three-dimensional version of the floor plan that includes a visual representation of the sun in a particular position that is determined, at least in part, based on the first second position data.

Exemplary User Experience

Figure 6:
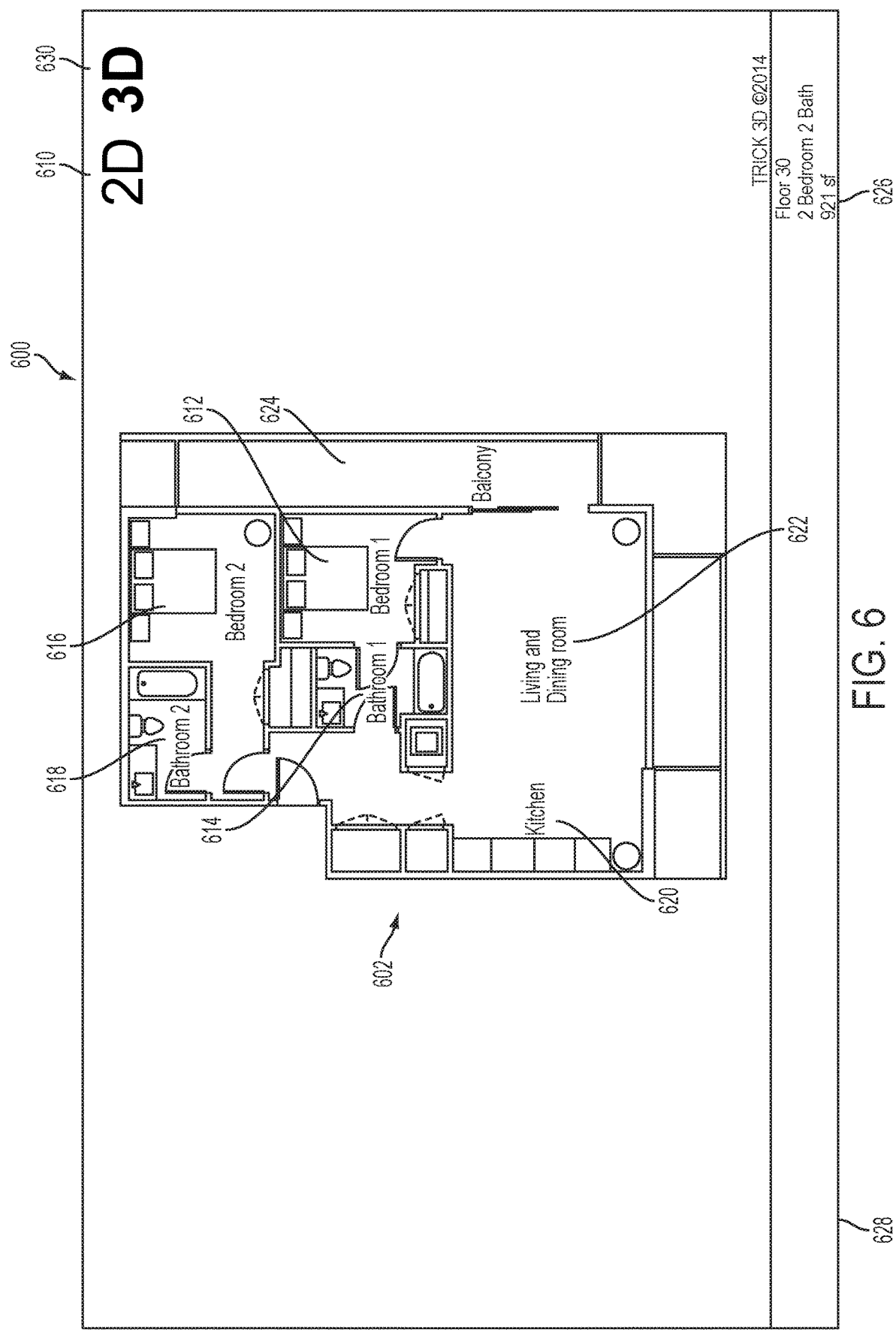
FIGS. 6-12 are exemplary screen displays of the system according to various embodiments.

FIG. 6 depicts a 2D user interface 600 that a user may encounter when using the Base Floor Plan Generation Module 300, the View Module 400, and the Lighting Module 500. As may be understood from this figure, the system may default to a 2D floor plan of a specific building. For example, in this figure, the user interface 600 is set to a 2D floor plan 610. This particular floor plan 602 includes a first bedroom 612, a first bathroom 614, a second bedroom 616, a second bathroom 618, a kitchen 620, a living and dining room 622, and a balcony 624. The user interface 600 also displays the square footage 626 and the name of the building 628. The user may begin using the interactive floor plan by selecting the 3D button 630.

Figure 7:
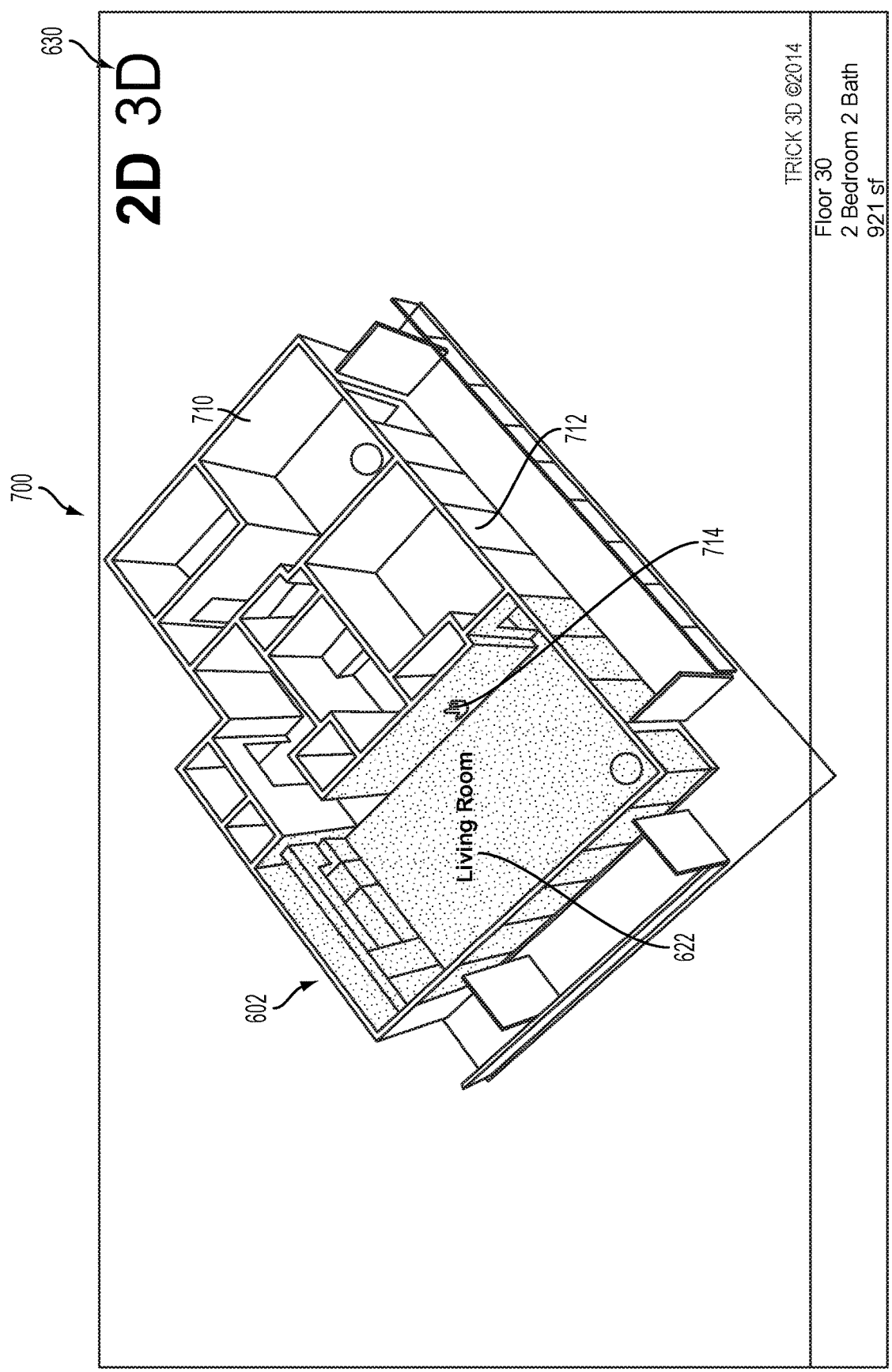

FIG. 7 depicts a 3D user interface 700 that a user may encounter when transitioning from the 2D user interface 600, shown in FIG. 6, by selecting the 3D button 630. After selecting the 3D button 630, the user interface will fluidly transition into the 3D user interface 700. The 3D user interface 700 displays the walls 710 of the floor plan 602 in a raised position. For instance, the 3D user interface 700 displays the walls 710 as they will appear between the various rooms of the particular unit in the building. The 3D user interface will also display the windows 712 of the particular unit in a 3D configuration. In using the 3D user interface, the user may place a cursor 714 over a particular room, such as the living room 622, to select to enter that room.

Figure 8:
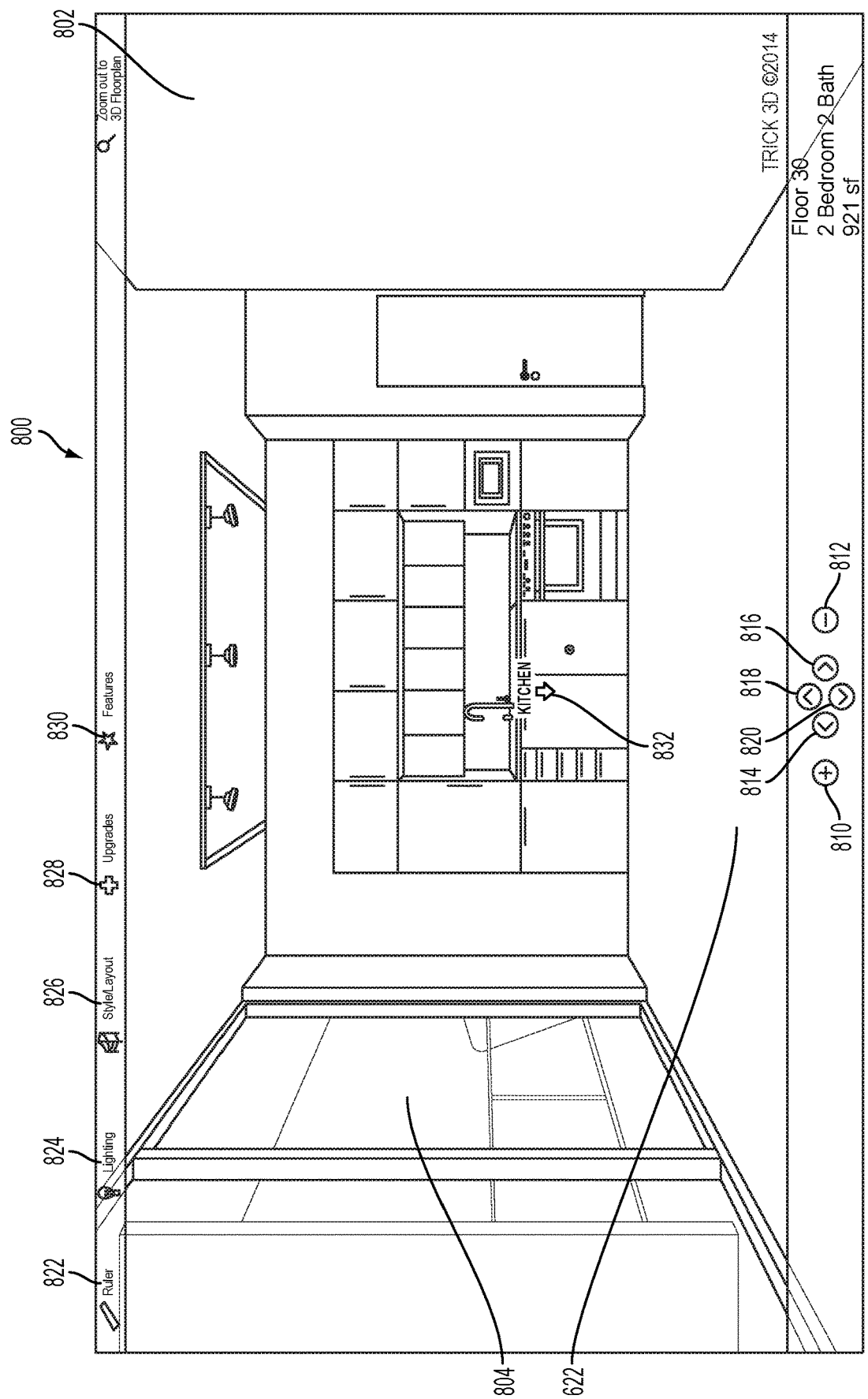

FIG. 8 depicts a first perspective interactive user interface 800 that a user may encounter when transitioning from the 3D user interface 700, shown in FIG. 7, after the user has selected to enter a particular room, such as the living room 622. Upon entering the living room 622, the first perspective interactive user interface 800 displays the walls 802 and windows 804 of the particular unit. The user is able to zoom in using the zoom in button 810, zoom out using the zoom out button 812, pan left using the pan left button 814, pan right using the pan right button 816, pan up using the pan up button 818, and pan down using the pan down button 820. In the alternative, the user may place the cursor (not shown) in the direction the user wishes to view to pan around the room or zoom in or out of a particular area of a room. The pan up button 818 may be used to view the ceiling and the lighting elements found in the ceiling, while the pan down button 820 may allow the user to view the floor and other materials on the floor such as rugs.

The user interface 800 also allows the user to measure different parts of the room using the ruler button 822. In addition to the ruler button 822, the user can change the lighting in the room and the light entering the room from outside by using the lighting button 824. The user may also add furniture or adjust the style or layout of the room by using the style/layout button 826. If the user is interested in what the particular unit will look like with certain upgrades, the user can select the upgrades button 828 to make upgrades such as granite countertops or other high-end finishes. Also, the user may save changes made or perform other functions using the features button 830. While in the first perspective interactive user interface 800, the user is also given the option to enter other rooms in the floor plan. For instance, while in the living room 622, the user is given the option to enter the kitchen by selecting the kitchen arrow 832.

Figure 9:
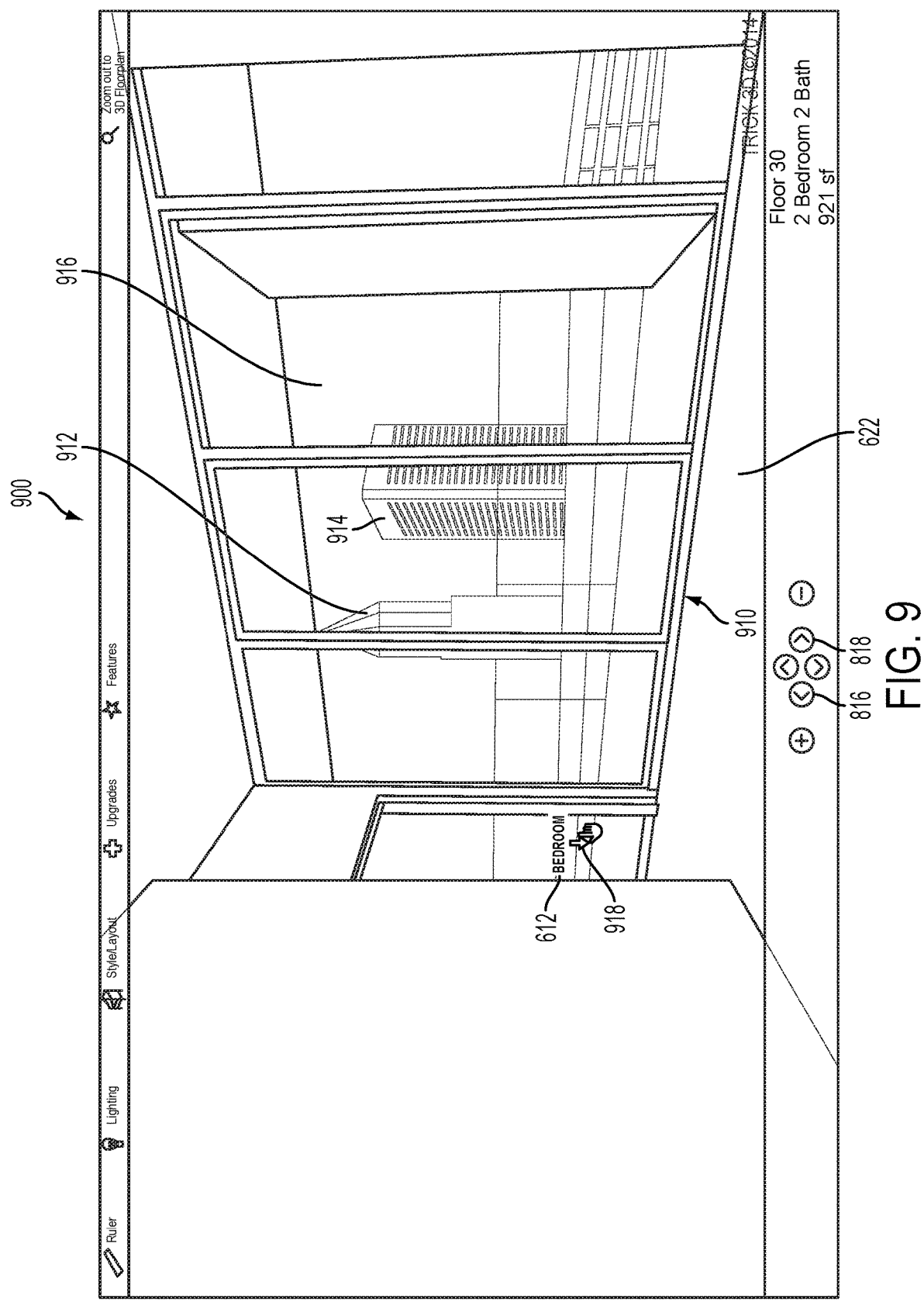

FIG. 9 depicts a second perspective interactive user interface 900, which is a second perspective of the living room 622 shown in the first perspective interactive interface 800 of FIG. 8. The transition from FIG. 8 to FIG. 9 may be achieved by panning using the left or right pan buttons 816, 818. From the second perspective interactive user interface 900, the user is able to see what the outside view will be through the living room windows 910. For example, the user is able to see visual depictions of one or more adjacent buildings 912, 914 while inside the living room 622. In addition, the user is able to view a visual representation of the skyline 916 from the particular room. In various embodiments, the system will include other point of interest information in the views. Using the second perspective interactive user interface 900, the user is given the option to enter the first bedroom using the bedroom arrow 918.

Figure 10:
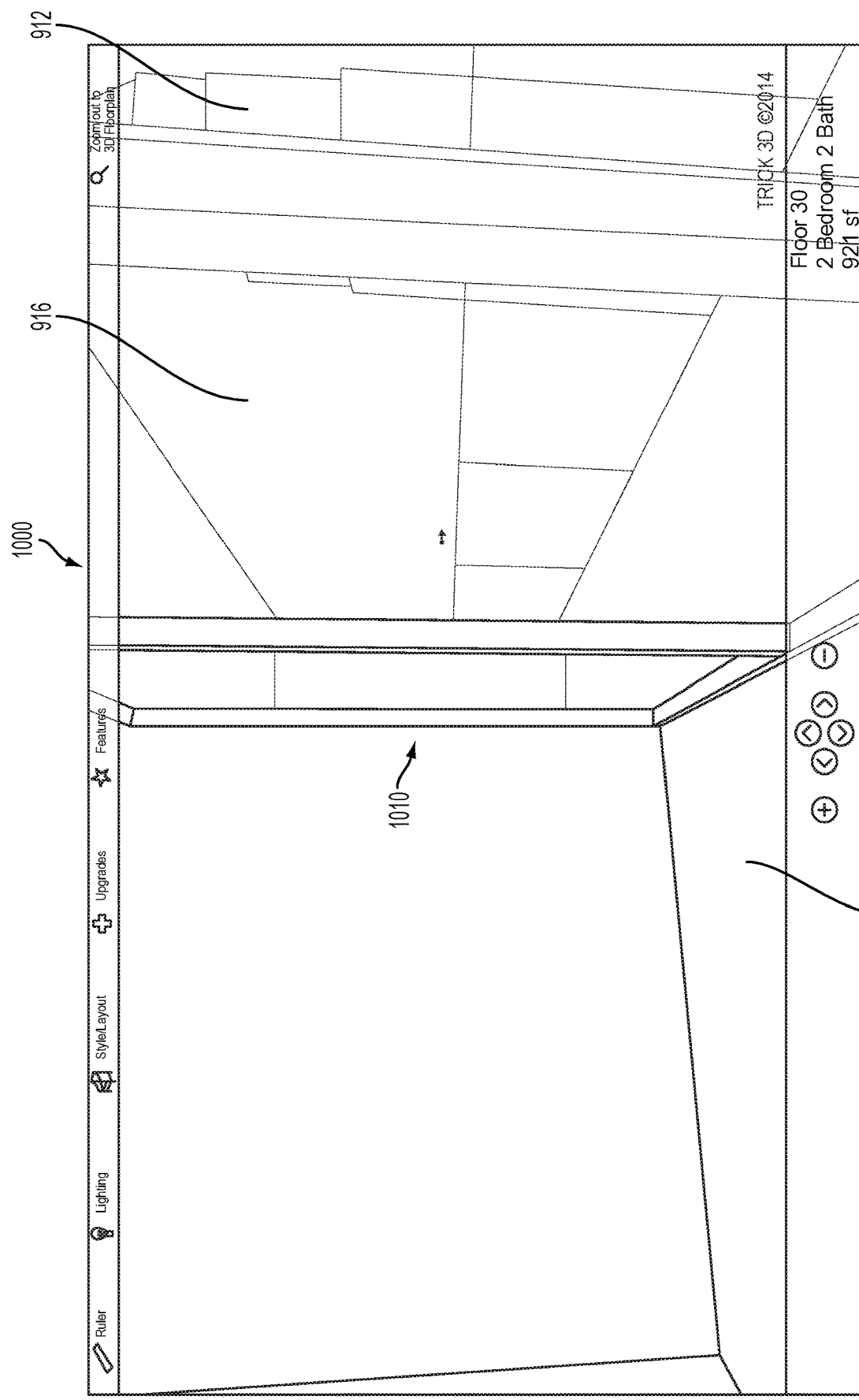

FIG. 10 depicts a first bedroom interactive user interface 1000 that a user may encounter after selecting the bedroom arrow 918, shown in FIG. 9. FIG. 10 depicts an interactive floor plan of the first bedroom 612, shown in FIG. 6. From the first bedroom interactive user interface 1000 the user is able to see what the outside view will be through the first bedroom windows 1010. The user is also able to virtually walk to the middle of the room to determine the size and shape of the room and the size and shape of the windows 1010. When the user pans left or right across the first bedroom windows 1010 from different perspectives within the first bedroom 612, the user is able to see the entire view that may include one or more similar views as that seen from the living room 622. For instance, from one particular perspective, the user is able to see the same building 912 and skyline 916 as seen in FIG. 9. This allows the user to experience the interactive floor plan as if the user were physically walking through the unit by (e.g., substantially seamlessly) meshing the view from one room with the view in another room.

Figure 11:
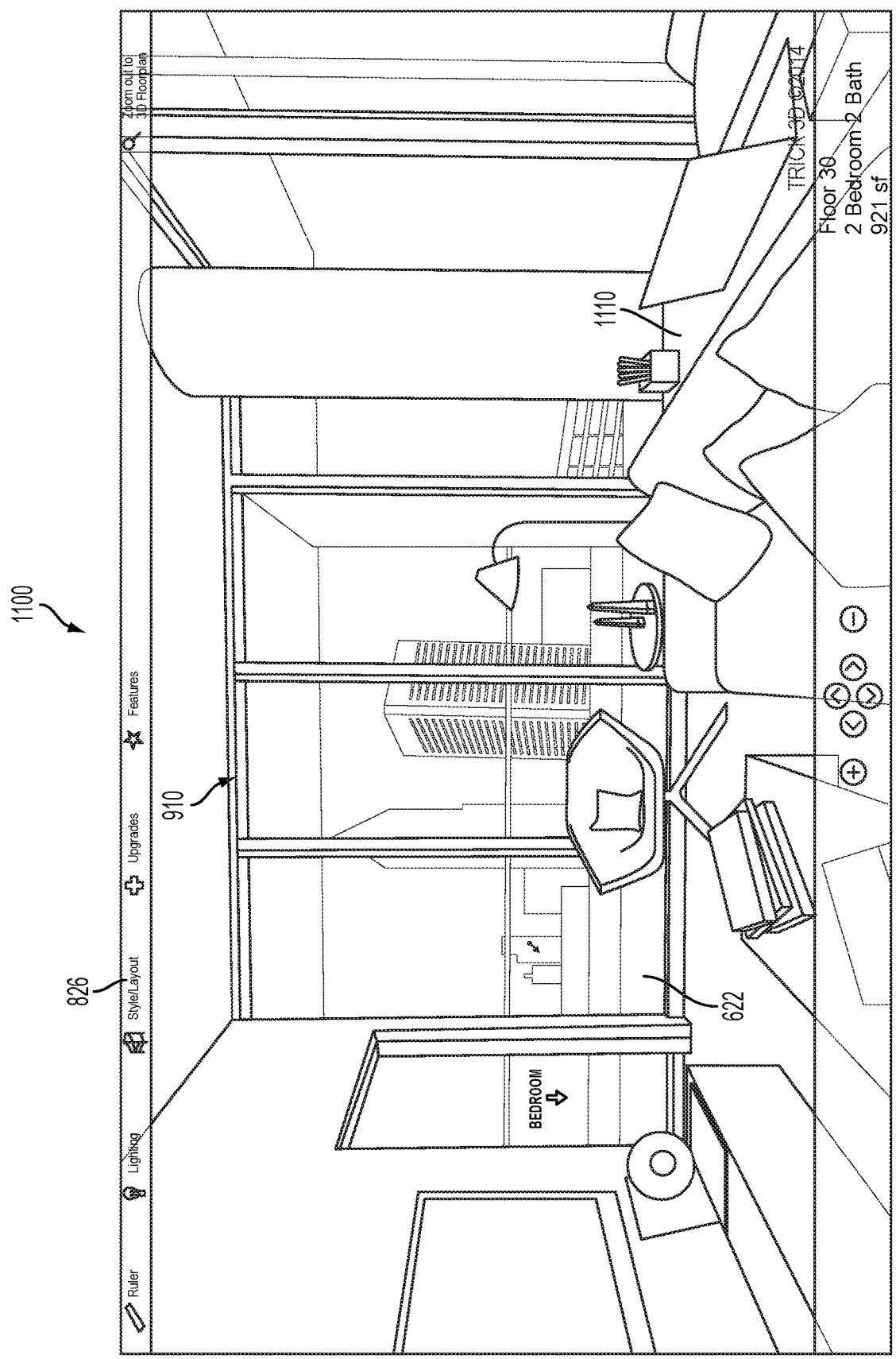

Returning to the living room 622, FIG. 11 depicts a furnished living room interactive user interface 1100, which may be achieved by selecting the style/layout button 826.

While FIG. 11 depicts a specific layout of the furniture in conjunction with a specific style, the system allows the user to alter the style. For instance, where the user prefers traditional furnishings, the user may select this option after selecting the style/layout button 826. The system also allows the user to move the furniture from one location to another. For instance, if the user prefers to have the desk 1110 positioned alongside the living room windows 910, the user is given the option to rotate and adjust the positioning of the desk in a realistic way (e.g., a three-dimensional rotation). The system may also allow a user to designate the size of specific pieces of furniture to determine how these pieces will fit in the particular room. The style/layout button 826 may also contain variations in materials used to design the room (e.g., flooring material, kitchen cabinet material, kitchen countertop material, ceiling designs, etc.). Moreover, the style/layout button 826 may allow the user to alter the wall color of each particular room.

Figure 12:
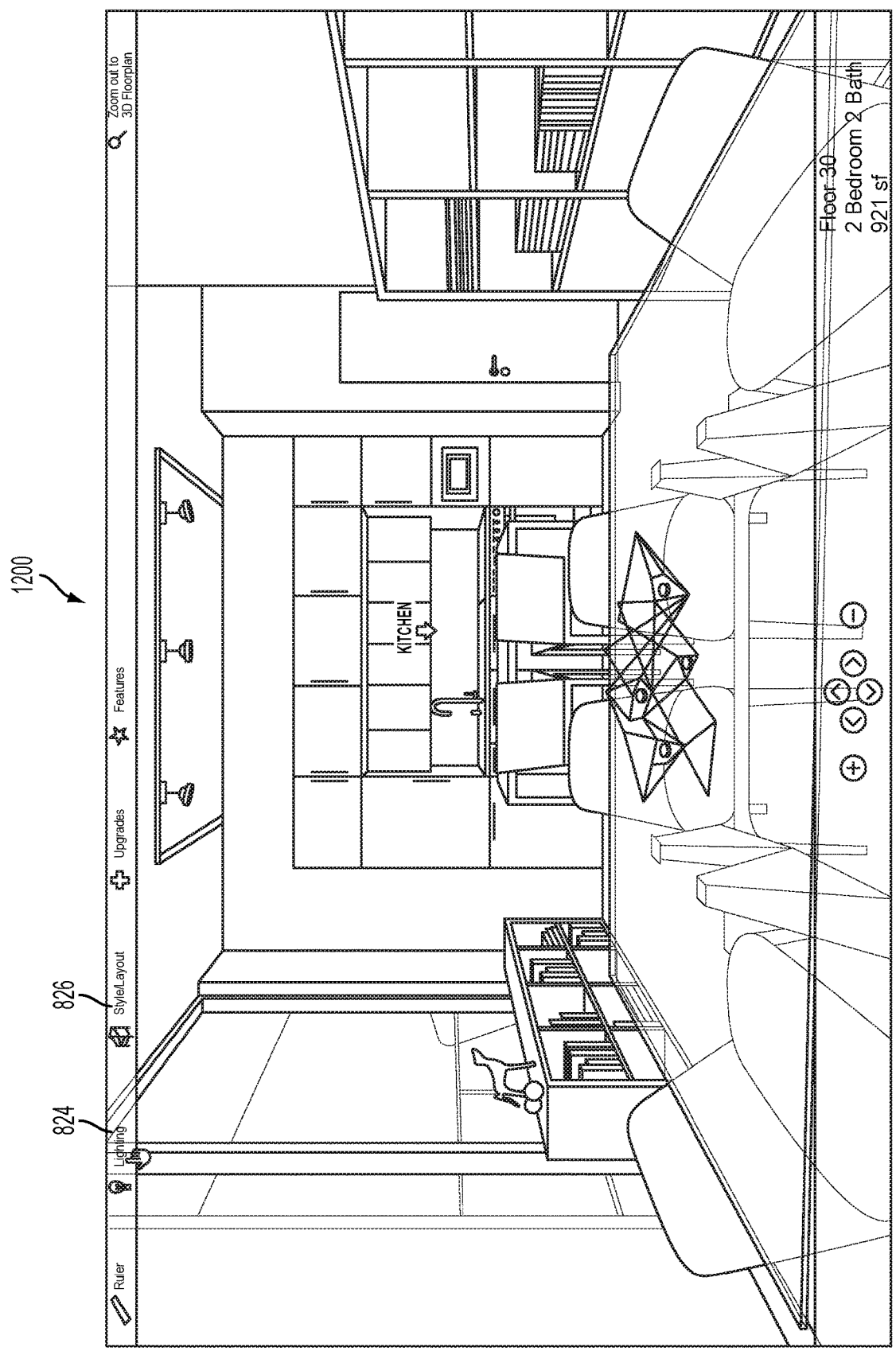

Similar to FIG. 11, FIG. 12 depicts a furnished dining room interactive user interface 1200, which may be achieved by selecting the style/layout button 826. In addition, FIG. 12 also depicts a lighting scheme produced by selecting the lighting button 824. While the current lighting scheme includes nighttime outside lighting and dimmed overhead lighting inside, the system may allow the user to view all spectrums of inside and outside light using the lighting button 824. In addition, the lighting button 824 may allow the user to add additional lighting sources such as lamps. In viewing these varying lighting schemes, the system will produce shadows attributable to the various indoor and outdoor lights. The system will also display reflective surfaces as they would appear in real life. In addition, by changing the wall color using the style/layout button 826, the lighting schemes will be changed to accurately depict such changes. For instance, where a dark wall color is selected, the room will appear darker even though the indoor and outdoor lighting have not been changed.

Exemplary User Experience—Alternate Embodiment

Systems according to various embodiments may use one or more of the techniques described herein to allow a user to experience (e.g., view) a simulated version of the interior of a vehicle, such as an aircraft, automobile, boat, spaceship, or other vehicle. In particular, the system may be adapted to execute the steps of: (1) receiving a two dimensional or three-dimensional representation of an interior of a vehicle, such as an aircraft; (2) using the representation to generate a three dimensional representation of an interior of the vehicle; and (3) allowing a user to virtually navigate through an interior of the vehicle (e.g., as described above in reference to buildings). In particular embodiments, one or more of the techniques described above may be used to generate and display an interior outward facing view through one of the vehicle's windows in order to depict what the user would see when looking through the window from the interior of the aircraft (e.g., a wing of the aircraft, etc . . . ).

Figure 13:
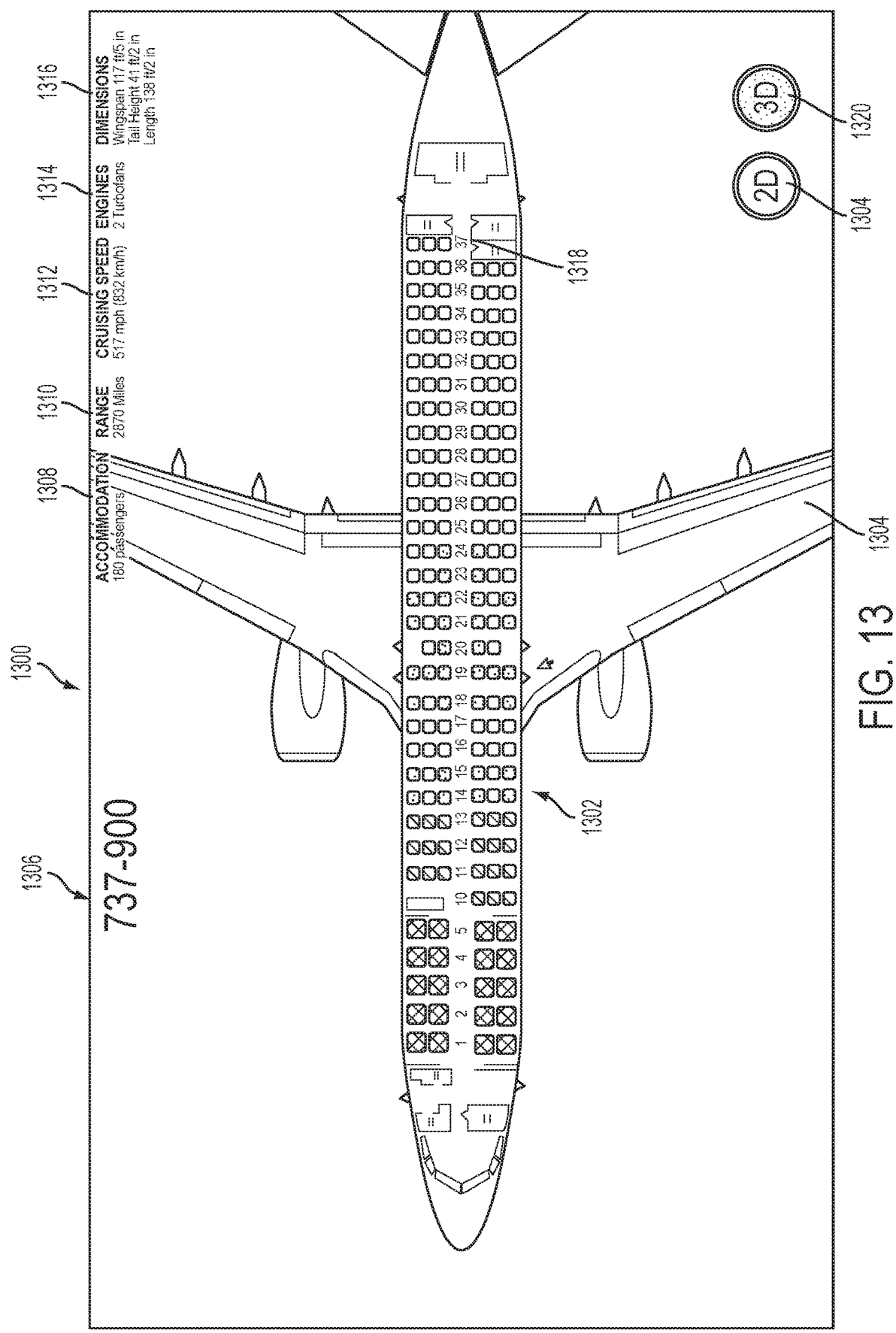
FIGS. 13-21 are exemplary screen displays of an alternate embodiment of the system according to various embodiments, showing the interior of an aircraft.

FIG. 13 depicts a 2D airplane user interface 1300 that a user may encounter when using the Base Floor Plan Generation Module 300, the View Module 400, and the Lighting Module 500. As may be understood from this figure, the system may default to a 2D floor plan, or seat map, of a particular airplane 1302. For example, in this figure, the user interface 1300 is set to a 2D floor plan 1304. The user interface displays the name of the particular airplane 1306, the accommodations of the particular airplane 1308, the range of the particular airplane 1310, the cruising speed of the particular airplane 1312, the engines of the particular airplane 1314, the dimensions of the particular airplane 1316, and the number of rows of seats of the particular airplane 1318. The user may begin using the interactive airplane seat map by selecting the 3D button 1320.

Figure 14:
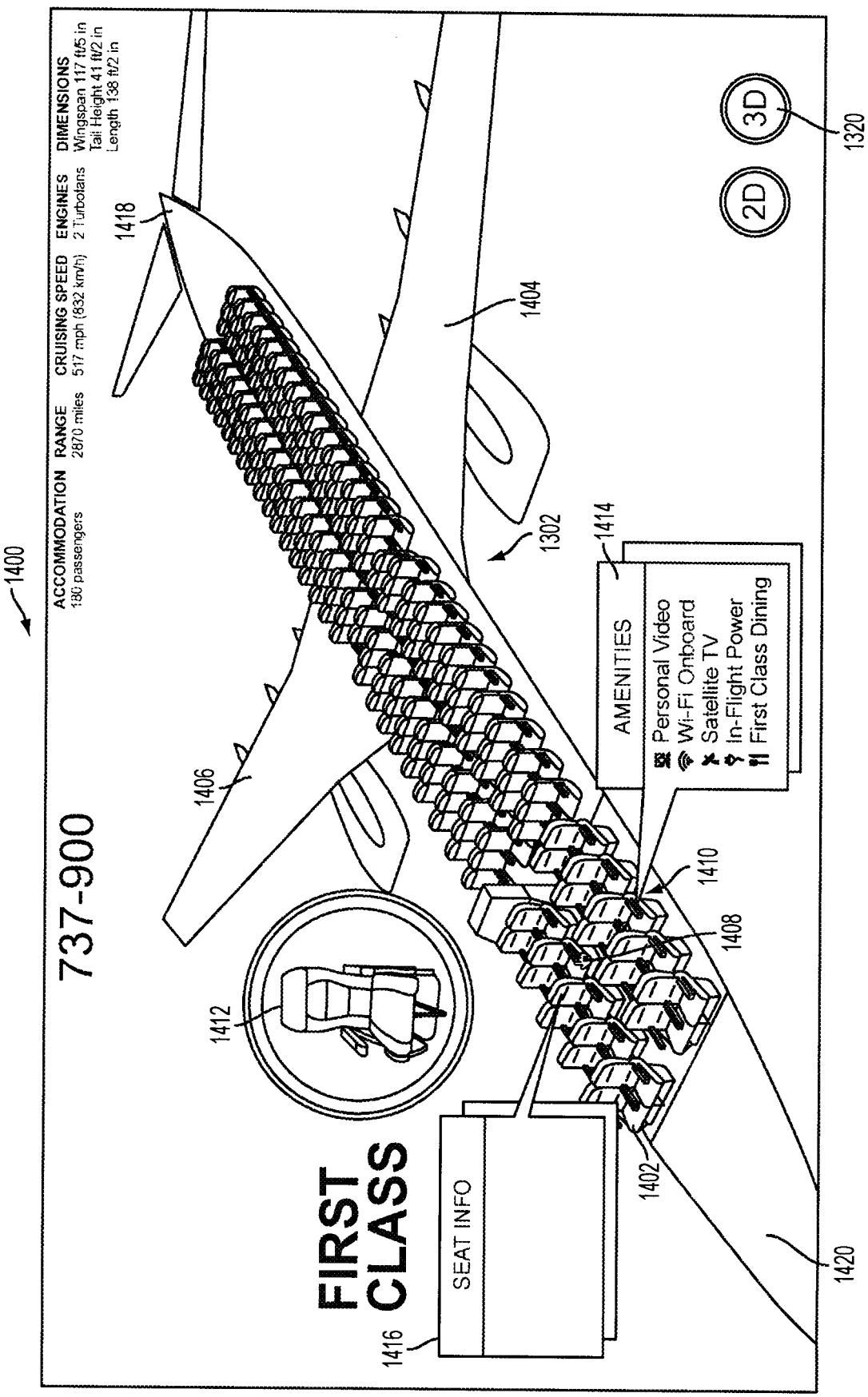

FIG. 14 depicts a 3D airplane user interface 1400 that a user may encounter when transitioning from the 2D airplane user interface 1300, shown in FIG. 13, by selecting the 3D button 1320. After selecting the 3D button 1320, the 2D airplane user interface 1300 will fluidly transition into the 3D airplane user interface 1400. The 3D airplane user interface 1400 displays the seats 1402 of the particular airplane 1302 in 3D (i.e., showing three dimensions of the seats). For example, the 3D airplane user interface 1400 shows the seats 1402 as they appear in the particular airplane 1302. The 3D airplane user interface 1400 may also display the location of the wings of the particular airplane 1404, 1406 in relation to the seats 1402. In addition to the wings 1404, 1406, the 3D airplane user interface 1400 also displays the location of the tail of the plane 1418 and the cockpit 1420.

In using the 3D airplane user interface 1400, the user may place a cursor 1408 over a particular section, such as the first class section 1410, to view a 360-degree view of a first class seat 1412, the amenities of the first class seat 1414, and the seat information of the first class seat 1416. The 360-degree view of the first class seat 1412 may spin the seat in 360-degrees allowing the user to view the seat from the front, the back, and from all sides. The amenities 1414 and the seat information 1416 may be the same for each seat in that particular section. The user may also use the cursor 1408 to select a particular section to enter, as will be discussed below.

Figure 15:
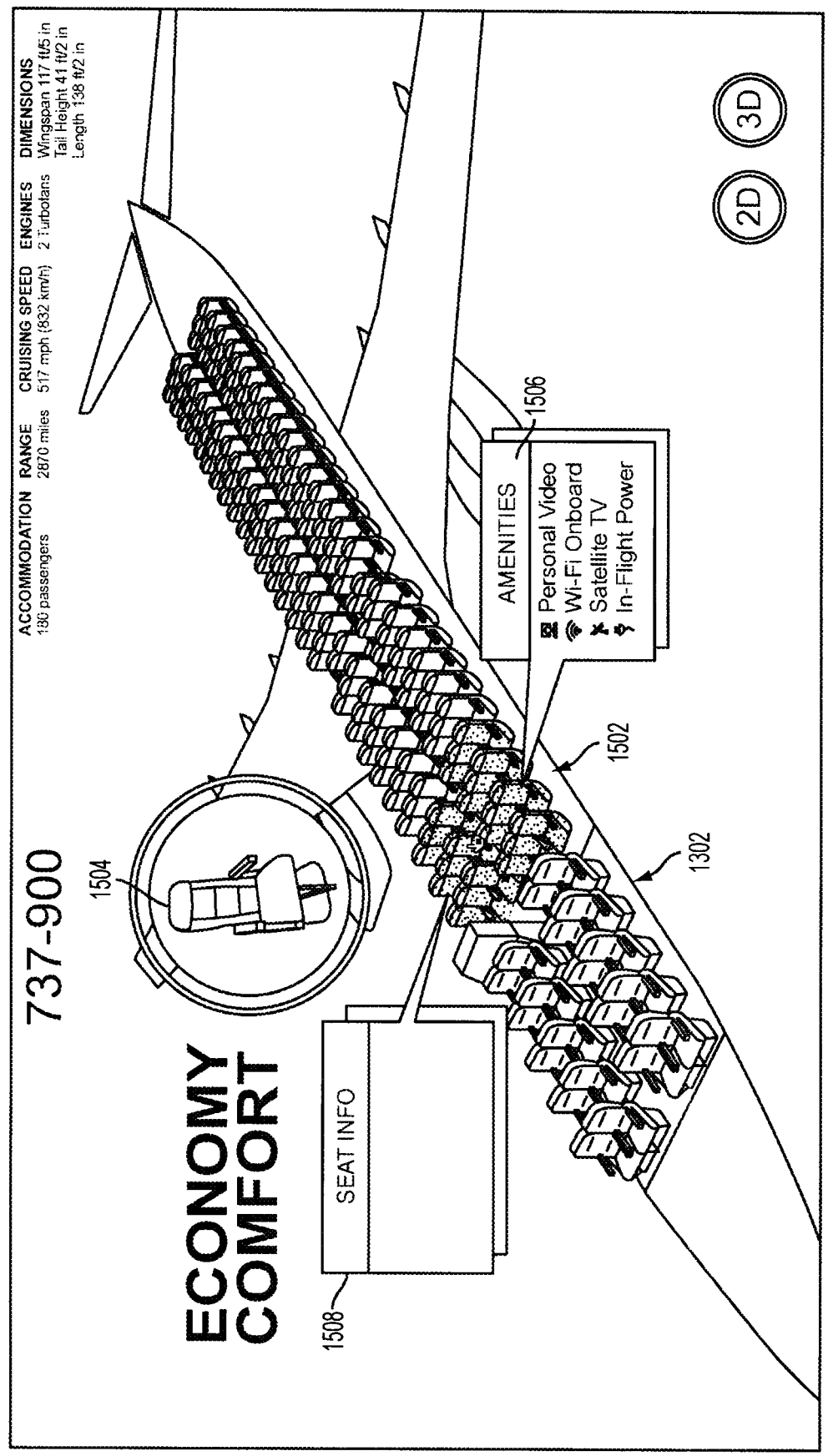

Similar to FIG. 14, FIG. 15 depicts a second particular section, such as the economy comfort section 1502 of the airplane 1302. As seen in FIG. 14, the second particular section also displays a 360-degree view an economy comfort seat 1504, the amenities of the economy comfort seat 1506, and the seat information of the economy comfort seat 1508. In various embodiments, the user interface may include any number of different sections of a particular airplane.

Figure 16:
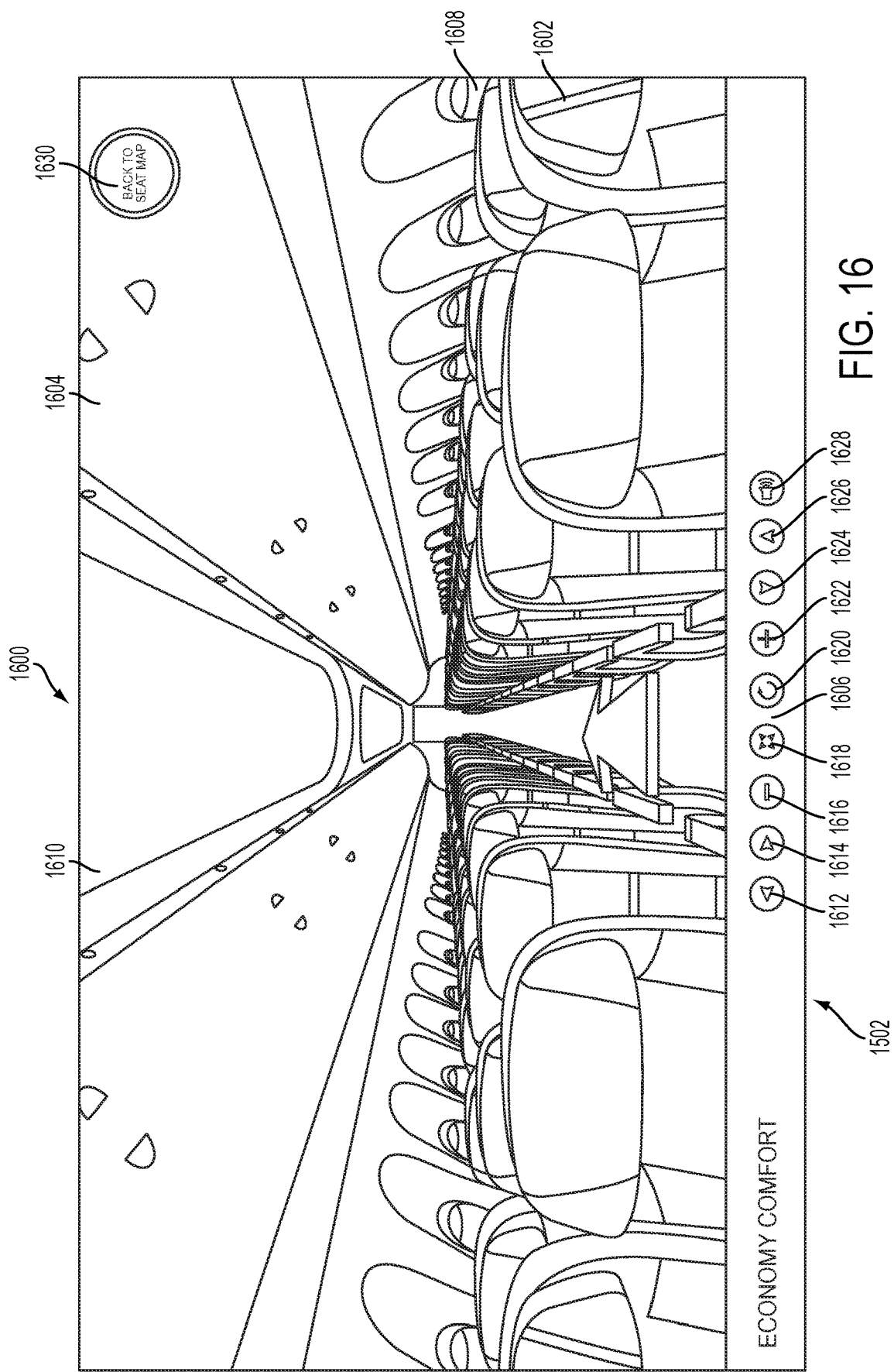

FIG. 16 depicts a first perspective economy comfort interactive user interface 1600 (facing the tail of the plane) that a user may encounter when transitioning from the 3D airplane user interface 1400, shown in FIG. 15, after the user has selected to enter a particular section, such as the economy comfort section 1502, by placing the cursor 1408 (not shown) over that particular section. Upon entering the economy comfort section 1502, the first perspective economy comfort interactive user interface 1600 displays the seats 1602, the overhead compartments 1604, the aisle 1606, and the windows 1608 of the particular section. The first perspective economy comfort interactive user interface 1600 also displays the overhead lighting 1610 of the particular section.

In interacting with the first perspective economy comfort interactive user interface 1600, the user is able to pan left using the pan left button 1612, pan right using the pan right button 1614, zoom out using the zoom out button 1616, expand the screen using the expand button 1618, turn around in the aisle using the rotate button 1620, zoom in using the zoom in button 1622, pan down using the pan down button 1624, pan up using the pan up button 1626, and adjust the volume of the sound being played in the first perspective economy comfort interactive user interface 1600 using the volume button 1628.

In the alternative, the user may place the cursor in the direction the user wishes to view to pan around the particular section of the airplane and/or zoom in or out of a particular area of the plane. The pan up button 1626 may be used to view the ceiling and the lighting elements found in the ceiling, while the pan down button 1624 may allow the user to view the floor and the lighting elements found in the floor. The user is also able to virtually walk down the aisle 1606 to determine the size and shape of the seats 1602 and the size and shape of the windows 1608. The first perspective economy comfort interactive user interface 1600 also includes a back to seat map button 1630 that the user may select, which will transition fluidly from the 3D airplane user interface 1400, shown in FIG. 14, to the 2D airplane user interface 1300, shown in FIG. 13.

Figure 17:
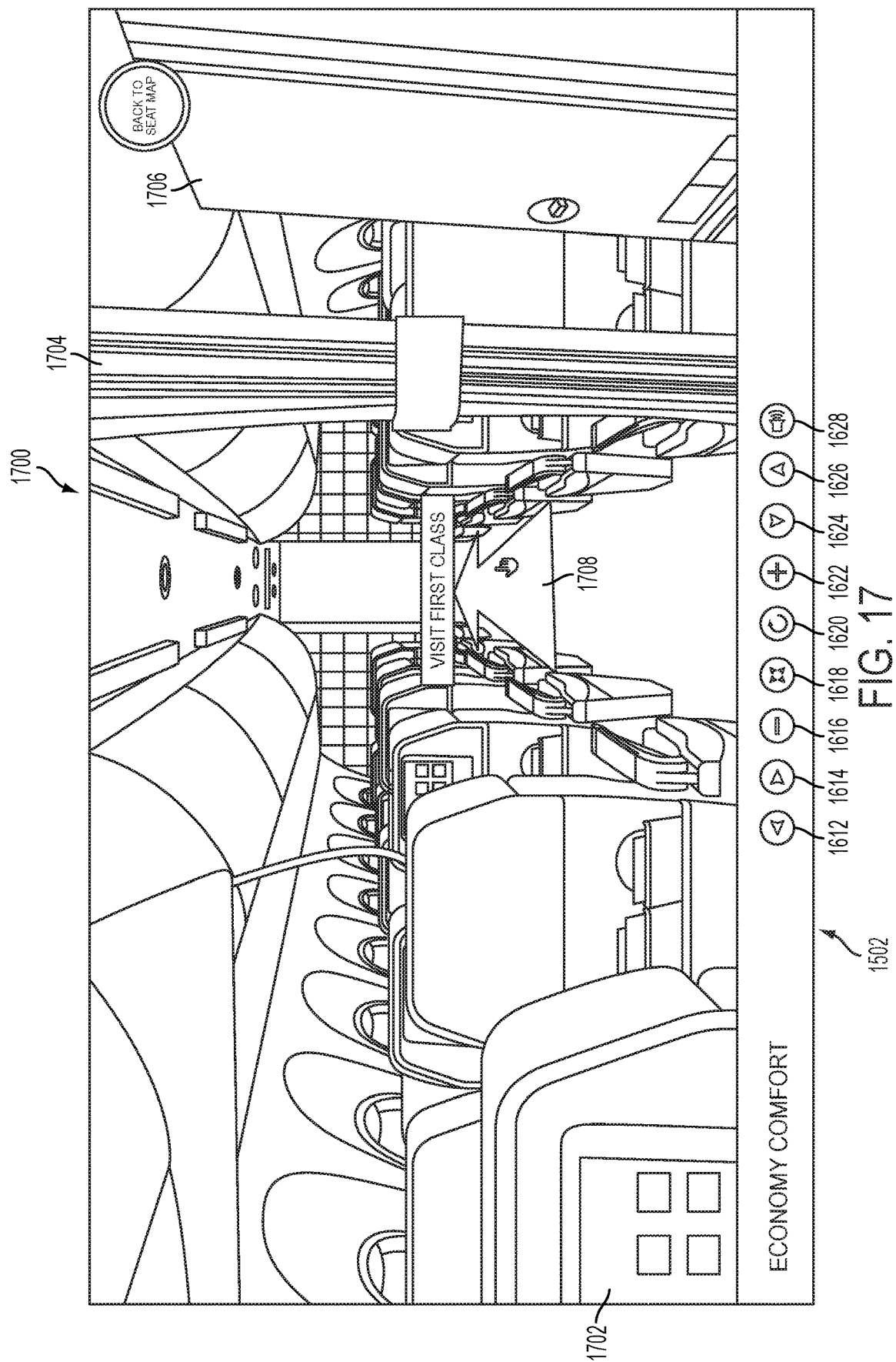

FIG. 17 depicts a second perspective economy comfort interactive user interface 1700 (facing the cockpit of the plane) that a user may encounter when using the pan left button 1612 or the pan right button 1614 while in the first perspective economy comfort interactive user interface 1600, shown in FIG. 16. Thus, FIG. 17 is a second perspective of the economy comfort section 1502 of FIG. 16. The transition from FIG. 16 to FIG. 17 may be achieved by panning using the left or right pan buttons 1612, 1614.

From the second perspective economy comfort interactive user interface 1700, the user is able to see what the view will be from the economy comfort section 1502 while facing the cockpit (not numbered) of the plane. The second perspective economy comfort interactive user interface 1700 also allows the user to see the seatback screens 1702, the privacy curtain 1704, and the nearest lavatory 1706. In various embodiments, the system may allow a user to interact with the seatback screens 1702. While in the second perspective economy comfort interactive user interface 1700, the user is also given the option to enter other sections of the airplane. For instance, while in the economy comfort section 1502, the user is given the option to enter the first class section by selecting the visit first class arrow 1708.

Figure 18:
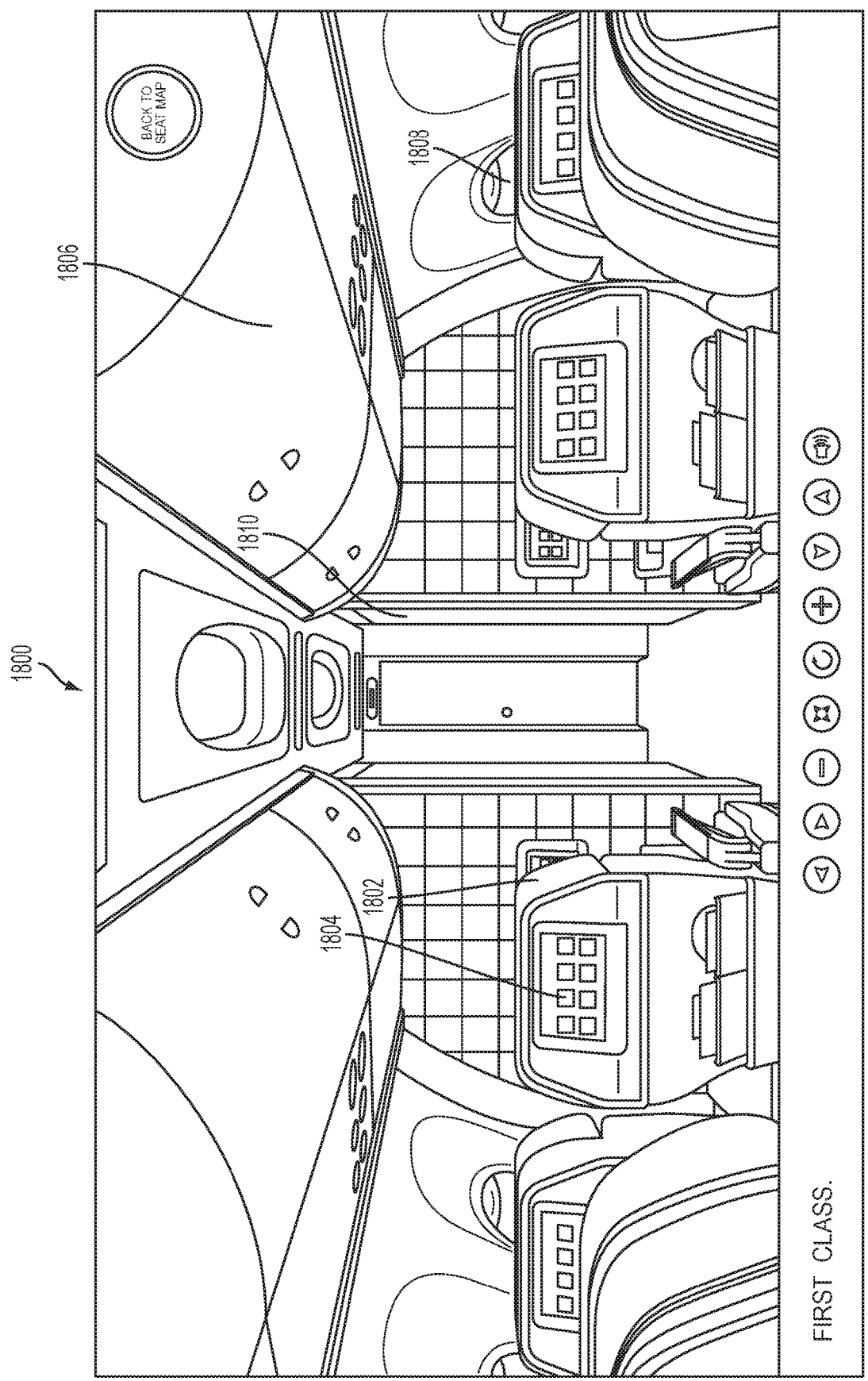

FIG. 18 depicts a first perspective first class interactive user interface 1800 that a user may encounter after selecting the first class arrow 1708, shown in FIG. 9. Similar to FIG. 17, from the first perspective first class interactive user interface 1800, the user is able to see what the view will be from the first class section 1410 while facing the cockpit of the plane. The first perspective first class interactive user interface 1700 also allows the user to see the first class seats 1802, the seatback screens 1804, the overhead bins 1806, the windows 1808, and the nearest lavatory 1810.

Figure 19:
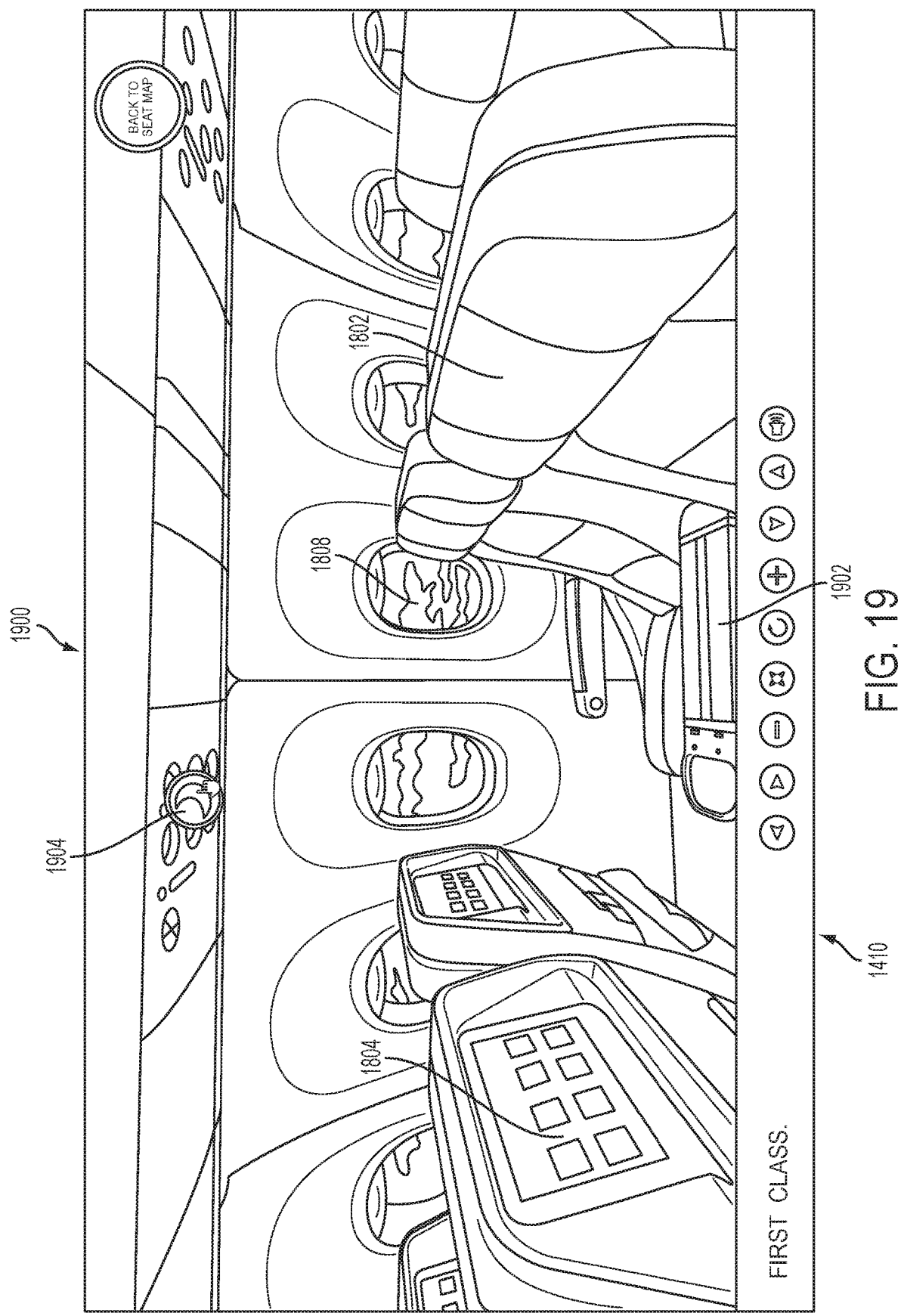

In FIG. 19, which depicts a second perspective first class interactive user interface 1900, when the user pans left or right around the first class section 1410 from the first perspective first class interactive user interface 1800 shown in FIG. 18, the user is able to see the view that may be seen from the windows 1808. The view may include the sky and one or more heavenly bodies in the sky. In the alternative, the view may include a view that would be seen during taxing, takeoff, and/or while parked at the gate. The view may also include the natural light and man-made of the first class section 1410 depending upon the different times of the day. This allows the user to experience the interactive seat map 1900 as if the user were physically seated or walking through the airplane by seamlessly meshing the view from one window to the next. The second perspective first class interactive user interface 1900 depicts the first class seats 1802 and the seatback screens 1804. In addition, the second perspective first class interactive user interface 1900 includes the size and location of armrests 1902 and a nighttime lighting button 1904.

Figure 20:
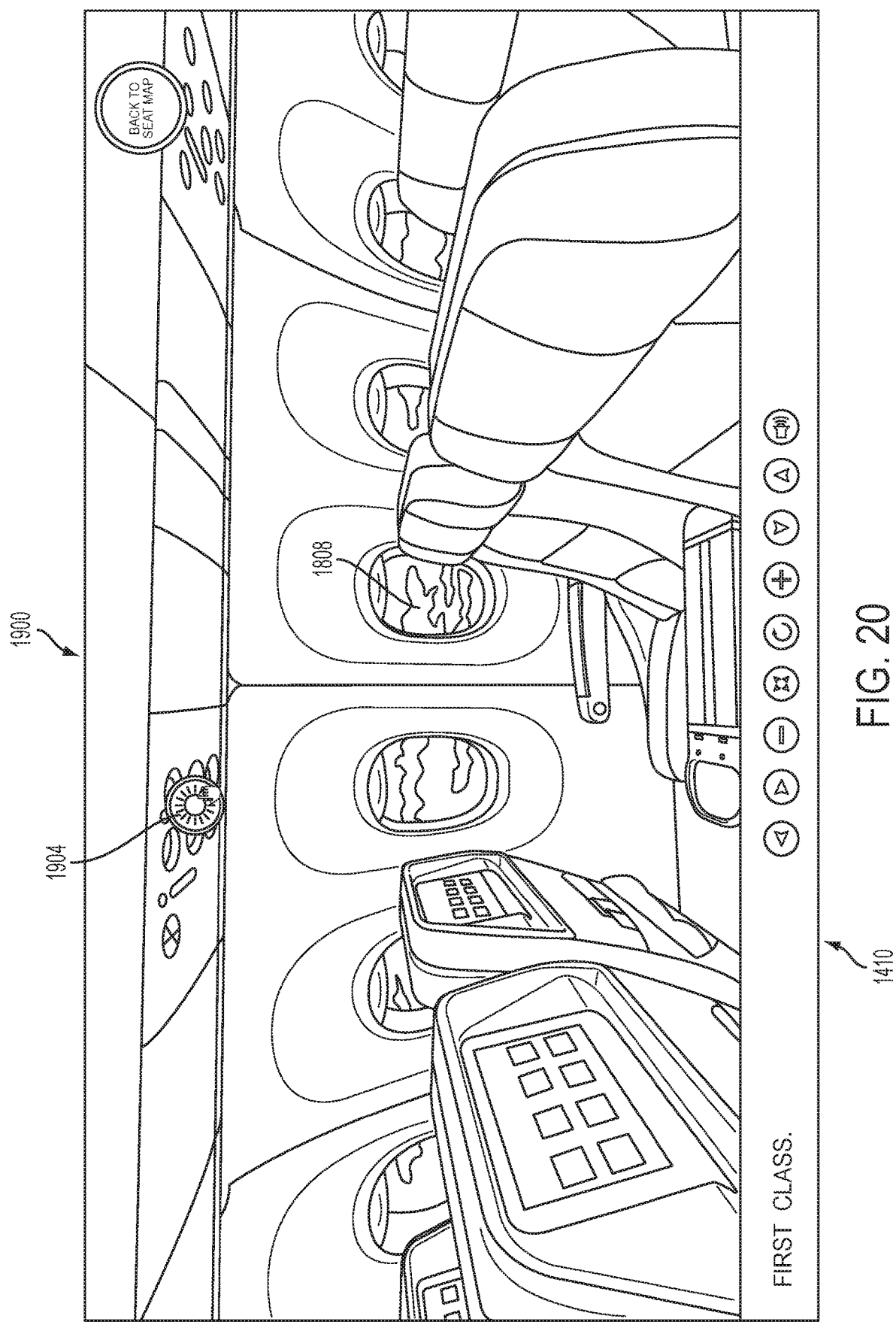

FIG. 20 depicts a transitional phase of the second perspective first class interactive user interface 1900 that a user may encounter after selecting the nighttime lighting button 1904, shown in FIG. 19. As may be seen in FIG. 20, the lighting has been dimmed in the first class section 1410 and the windows 1808 have the shades up.

Figure 21:
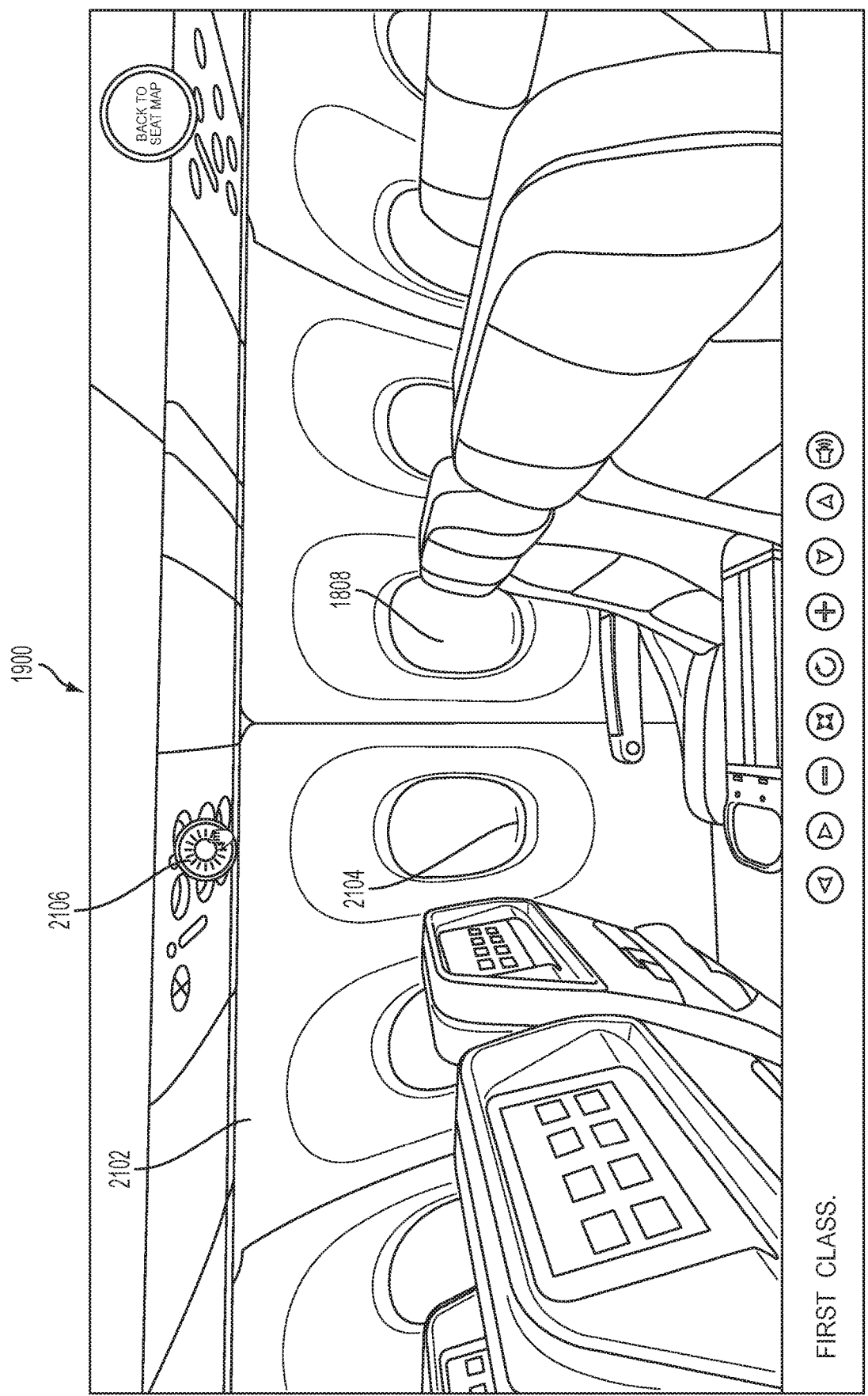

Turning to FIG. 21, the user is able to see the final phase of the second perspective first class interactive user interface 1900 that a user may encounter after selecting the nighttime lighting button 1904, shown in FIG. 19. As may be seen in FIG. 21, the lighting has been reduced to dim lights 2102 over the windows 1808 and the shades 2104 have been pulled down to cover the windows 1808. Thus, the nighttime lighting button 1904, shown in FIG. 19, may be used to demonstrate what nighttime would be like on the airplane. Once the user selects the nighttime lighting button 1904, shown in FIG. 19, the user is then given the option to select a daytime lighting button 2106 to again view what the daytime lighting would be like on the airplane.

Operating System

In particular embodiments, one or more of the techniques described herein may be used to create a three dimensional user interface for an operating system. In particular embodiments, for example, the user interface may depict a three-dimensional room that is filled with one or more objects (e.g., a desk, a radio, a whiteboard, a globe, etc . . . ). In particular embodiments, the system is configured so that, in response to a user selecting (e.g., "clicking" on) a particular object, the system will run one or more applications that correspond to the selected object. For example, the system may be adapted to run a music application (e.g., iTunes or Spotify) in response to the user selecting an image of a radio that is displayed in the virtual room. As another example, the system may be adapted to run a document editing application (e.g., Microsoft Word) in response to the user selecting an image of a document that is displayed in the virtual room.

The operating system may also include one or more features that allow a user to "gamify" their normal routine. For example, the system may be adapted to award a user points for completing items displayed on a checklist on a virtual whiteboard within the virtual room, or for completing any other suitable tasks.

CONCLUSION

Many modifications and other embodiments of the invention will come to mind to one skilled in the art to which this invention pertains, having the benefit of the teaching presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for the purposes of limitation.

What is claimed is:

1. A non-transitory computer-readable medium storing computer-executable instructions for:

receiving a floor plan comprising at least one room within a floor of a first building, the room comprising a plurality of walls and at least one window;

receiving a set of building location data that includes the height and orientation of the at least one room;

receiving a set of external building data representing the size, shape, location and orientation of a second building that is disposed adjacent the first building;

receiving a set of sun position data regarding at least the approximate position, in the sky, of the sun when viewed from the first building at least one particular time; and using the set of sun position data, along with the floor plan, the set of building location data, and the set of external building data to create a three-dimensional version of the floor plan, the three-dimensional version of the floor plan comprising a view out of the window that comprises:

a view of the second building;

a scale view of the first building that depicts, at least substantially to scale, a distance between the first building and the second building; and a visual representation of the sun in a position that is determined, at least in part, based on the set of sun position data.

2. The non-transitory computer-readable medium of claim 1, wherein:

the set of external building data further comprises data representing:

a size, shape, location, and orientation of a third building that is disposed adjacent the first building; and a size, shape and location of one or more roadways that are disposed adjacent the first building; and the view out of the window comprises:

a scale view of the second building that depicts, at least substantially to scale, a distance between the first building and the second building;

a scale view of the third building that depicts, at least substantially to scale, a distance between the first building and the third building;

a scale view of the roadway that depicts, at least substantially to scale, a distance between the first building and the roadway.

3. The non-transitory computer-readable medium of claim 1, wherein the set of sun position data comprises a first set of sun position data and a second set of sun position data, and wherein the computer-readable medium further stores computer-executable instructions for:

receiving the first set of sun position data regarding a first position, in the sky, of the sun when viewed from the first building at a first particular time of day;

receiving the second set of sun position data regarding a second position, in the sky, of the sun when viewed from the first building at a second particular time of day;

using the first set of sun position data, the second set of sun position data, the floor plan, the set of building location data, and the set of external building data, to create the three-dimensional version of the floor plan, wherein:

the computer-readable medium further stores computer-executable instructions for:

receiving a request from a user to view a three-dimensional version of the floor plan that depicts the at least one room at the first particular time of day; and in response to receiving the request, displaying a particular three-dimensional version of the floor plan that comprises:

a scale view of the first building that depicts, at least substantially to scale, a distance between the first building and the second building; and a visual representation of the sun in a particular position that is determined, at least in part, based on at least one of the first sun position data.

4. The non-transitory computer-readable medium of claim 1, wherein the set of sun position data comprises at least the approximate path that the sun travels in the sky, when viewed from the first building, as the earth rotates over the course of at least four daylight hours on a particular day, and wherein the visual representation of the sun in the position that is determined, at least in part, based on the set of sun position data comprises a visual representation of the sun as the sun travels along the approximate path.

5. The non-transitory computer-readable medium of claim 1, wherein the step of receiving the set of external building data representing the size, shape, location and orientation of a second building that is disposed adjacent the first building comprises receiving the set of external building data from a map.

6. The non-transitory computer-readable medium of claim 5, wherein the map comprises an interactive map.

7. The non-transitory computer-readable medium of claim 1, wherein the computer-readable medium further stores computer-executable instructions for:

receiving a room configuration of the at least one room within a floor of a first building, the room configuration including the size and shape of the at least one room;

receiving a set of furniture data that includes the size and shape of at least one piece of furniture; and using the room configuration and set of furniture data to create the three-dimensional version of the floor plan with furniture, wherein the computer-readable medium further stores computer-executable instructions for:

receiving a request from a user to move the furniture; and in response to receiving the request, displaying the moving of the furniture in the three-dimensional version of the floor plan.

8. A computer-implemented method of generating a three-dimensional floor plan, the method comprising the steps of:

receiving a floor plan of a first building comprising at least one room, the room comprising a plurality of walls and at least one window;

receiving building location data representing the size, shape, location, and orientation of the first building;

receiving external building data representing the size, shape, location, and orientation of a second building that is disposed adjacent the first building;

receiving sun position data regarding at least the approximate path that the sun travels in the sky, when viewed from the first building, as the earth rotates over the course of at least four daylight hours on a particular day; and using the floor plan, the building location data, the external building data, and the sun position data to create a three-dimensional version of the floor plan, the three-dimensional version of the floor plan comprising a view out of the at least one window that comprises:

a view of the second building;

a scale view of the first building that depicts, at least substantially to scale, a distance between the first building and the second building; and a visual representation of the sun in a position that is determined, at least in part, based on the sun position data.

9. The computer-implemented method of claim 8, wherein:

the particular day is a first particular day;

the set of sun position data is a first set of sun position data;

the three-dimensional version of the floor plan is a first three-dimensional version of the floor plan;
the path is a first path; and
the computer-implemented method further comprises the steps of:
receiving a second set of sun position data regarding at least an approximate second path that the sun travels in the sky, when viewed from the first building, as the earth rotates over the course of at least four daylight hours on a second particular day; and
using the second sun position data, along with the floor plan, the set of building location data, and the set of external building data, to create a second three-dimensional version of the floor plan, wherein the view out of the window within the second three-dimensional version of the floor plan comprises:
a scale view of the first building that depicts, at least substantially to scale, a distance between the first building and the second building; and
a visual representation of the sun as the sun travels along the second path.

10. A non-transitory computer-readable medium storing computer-executable instructions for:
receiving a floor plan comprising at least one room within a floor of a first building, the room comprising a plurality of walls and at least one window;
receiving a set of building location data that includes the height and orientation of the at least one room;
receiving a set of external building data representing the size, shape, location and orientation of a second building that is disposed adjacent the first building; and
receiving a first set of sun position data regarding a first position, in the sky, of the sun when viewed from the first building at a first particular time of day;
receiving a second set of sun position data regarding a second position, in the sky, of the sun when viewed from the first building at a second particular time of day;
using the first set of sun position data, the second set of sun position data, the floor plan, the set of building location data, and the set of external building data to create a three-dimensional version of the floor plan, the three-dimensional version of the floor plan comprising a view out of the window that comprises a view of the second building;
receiving a request from a user to view a three-dimensional version of the floor plan that depicts the at least one room at the first particular time of day; and
in response to receiving the request, displaying a particular three-dimensional version of the floor plan that comprises:
a scale view of the first building that depicts, at least substantially to scale, a distance between the first building and the second building; and
a visual representation of the sun in a particular position that is determined, at least in part, based on the first set of sun position data.

11. The non-transitory computer-readable medium of claim 10, wherein the particular three-dimensional version of the floor plan comprises:
shadowing, within a graphical depiction of an interior of the room, representing shadowing created by sunlight shining through the window when the sun is in the first position.

12. The non-transitory computer-readable medium of claim 10, wherein:
the particular three-dimensional version of the floor plan is a first three-dimensional version of the floor plan;
the visual representation of the sun in a particular position is a visual representation of the sun in a first position;
the computer-readable medium further stores computer-executable instructions for:
receiving a request from a user to view a three-dimensional version of the floor plan that depicts the at least one room at the second particular time of day; and
in response to receiving the request, displaying a second three-dimensional version of the floor plan that comprises:
a scale view of the first building that depicts, at least substantially to scale, a distance between the first building and the second building; and
a visual representation of the sun in a second position that is determined, at least in part, based on at least one of the second sun position data.

13. The non-transitory computer-readable medium of claim 12, wherein:
the first three-dimensional version of the floor plan comprises shadowing, within a graphical depiction of an interior of the room, representing shadowing created by sunlight shining through the window when the sun is in the first position; and
the second three-dimensional version of the floor plan comprises shadowing, within a graphical depiction of an interior of the room, representing shadowing created by sunlight shining through the window when the sun is in the second position.

14. A non-transitory computer-readable medium storing computer-executable instructions for:
receiving a floor plan comprising at least one room within a floor of a first building, the room comprising a plurality of walls and at least one window;
receiving a set of building location data that includes the height and orientation of the at least one room;
receiving a set of external building data representing the size, shape, location and orientation of a second building that is disposed adjacent the first building; and
receiving a set of sun position data regarding at least the approximate path that the sun travels in the sky, when viewed from the first building, as the earth rotates over the course of at least four daylight hours on a particular day; and
using the set of sun position data, the floor plan, the set of building location data, and the set of external building data to create a three-dimensional version of the floor plan, the three-dimensional version of the floor plan comprising a view out of the window that comprises:
a view of the second building;
a scale view of the first building that depicts, at least substantially to scale, a distance between the first building and the second building; and
a visual representation of the sun as the sun travels along the approximate path.

15. The non-transitory computer-readable medium of claim 14, wherein the three-dimensional version of the floor plan comprises:
shadowing, within a graphical depiction of an interior of the room, representing shadowing created by sunlight shining through the window when the sun is in the particular position.

16. The non-transitory computer-readable medium of claim 14, wherein:
the particular day is a first particular day;
the set of sun position data is a first set of sun position data;
the three-dimensional version of the floor plan is a first three-dimensional version of the floor plan;
the path is a first path; and
the computer-readable medium further stores computer-executable instructions for:
receiving a second set of sun position data regarding at least an approximate second path that the sun travels in the sky, when viewed from the first building, as the earth rotates over the course of at least four daylight hours on a second particular day; and
using the second sun position data, along with the floor plan, the set of building location data, and the set of external building data, to create a second three-dimensional version of the floor plan, wherein:
the view out of the window within the second three-dimensional version of the floor plan comprises:
a scale view of the first building that depicts, at least substantially to scale, a distance between the first building and the second building; and
a visual representation of the sun as the sun travels along the second path.

17. The non-transitory computer-readable medium of claim 16, wherein the first three-dimensional version of the floor plan comprises:
shadowing, within a graphical depiction of an interior of the room, representing shadowing created by sunlight shining through the window when the sun is in the particular position.

18. The non-transitory computer-readable medium of claim 16, wherein:
the first particular day is a first date received from a user, wherein:
the first date is a date occurring in a winter season;
the computer-readable medium further stores computer-executable instructions for:
receiving a third set of sun position data regarding at least an approximate third path that the sun travels in the sky, when viewed from the first building, as the earth rotates over the course of at least four daylight hours on the first date; and
using the third set of sun position data, along with the floor plan, the set of building location data, and the set of external building data, to create a third three-dimensional version of the floor plan, wherein the view out of the window within the third three-dimensional version of the floor plan comprises:
a scale view of the first building that depicts, at least substantially to scale, a distance between the first building and the second building; and
a visual representation of the sun as the sun travels along the third path.

19. The non-transitory computer-readable medium of claim 16, wherein:
the second particular day is a second date received from a user, the second date is a date occurring in a summer season;
the computer-readable medium further stores computer-executable instructions for:
receiving a fourth set of sun position data regarding at least an approximate fourth path that the sun travels in the sky, when viewed from the first building, as the earth rotates over the course of at least four daylight hours on the second date; and
using the fourth set of sun position data, along with the floor plan, the set of building location data, and the set of external building data, to create a fourth three-dimensional version of the floor plan, wherein:
the view out of the window within the fourth three-dimensional version of the floor plan comprises:
a scale view of the first building that depicts, at least substantially to scale, a distance between the first building and the second building; and
a visual representation of the sun as the sun travels along the fourth path.

* * * * *